United States Patent
Azam et al.

(10) Patent No.: US 9,614,043 B2
(45) Date of Patent: Apr. 4, 2017

(54) MOSFET TERMINATION TRENCH

(75) Inventors: Misbah Ul Azam, Fremont, CA (US); Kyle Terrill, Santa Clara, CA (US)

(73) Assignee: Vishay-Siliconix, Santa Clara, CA (US)

(*) Notice: Subject to any disclaimer, the term of this patent is extended or adjusted under 35 U.S.C. 154(b) by 0 days.

(21) Appl. No.: 13/370,243

(22) Filed: Feb. 9, 2012

(65) Prior Publication Data
US 2013/0207227 A1 Aug. 15, 2013

(51) Int. Cl.
| | |
|---|---|
| H01L 29/78 | (2006.01) |
| H01L 29/40 | (2006.01) |
| H01L 29/66 | (2006.01) |
| H01L 21/02 | (2006.01) |
| H01L 21/265 | (2006.01) |
| H01L 21/3105 | (2006.01) |
| H01L 21/762 | (2006.01) |
| H01L 29/417 | (2006.01) |

(52) U.S. Cl.
CPC ...... H01L 29/407 (2013.01); H01L 21/02532 (2013.01); H01L 21/02595 (2013.01); H01L 21/265 (2013.01); H01L 21/31053 (2013.01); H01L 21/76237 (2013.01); H01L 29/66734 (2013.01); H01L 29/7811 (2013.01); H01L 29/7813 (2013.01); H01L 29/41766 (2013.01)

(58) Field of Classification Search
CPC .......... H01L 29/7802; H01L 29/78132; H01L 29/0615; H01L 29/7811; H01L 29/7813; H01L 29/66712; H01L 29/66719; H01L 29/66727; H01L 29/66734
See application file for complete search history.

(56) References Cited

U.S. PATENT DOCUMENTS

| | | |
|---|---|---|
| 4,191,603 A | 3/1980 | Garbarino et al. |
| 4,375,999 A | 3/1983 | Nawata et al. |
| 4,399,449 A | 8/1983 | Herman et al. |
| 4,532,534 A | 7/1985 | Ford et al. |
| 4,584,025 A | 4/1986 | Takaoka et al. |

(Continued)

FOREIGN PATENT DOCUMENTS

| | | |
|---|---|---|
| CN | 102194701 A | 9/2011 |
| DE | 3 932 621 | 4/1990 |

(Continued)

OTHER PUBLICATIONS

Takemura et al., "BSA Technology for Sub-100nm Deep Base Bipolar Transistors", Int'l Elec. Devs. Meeting, 1987, pp. 375-378. Jan.

(Continued)

*Primary Examiner* — Zandra Smith
*Assistant Examiner* — Molly Reida

(57) ABSTRACT

A method, in one embodiment, can include forming a core trench and a termination trench in a substrate. The termination trench is wider than the core trench. In addition, a first oxide can be deposited that fills the core trench and lines the sidewalls and bottom of the termination trench. A first polysilicon can be deposited into the termination trench. A second oxide can be deposited above the first polysilicon. A mask can be deposited above the second oxide and the termination trench. The first oxide can be removed from the core trench. A third oxide can be deposited that lines the sidewalls and bottom of the core trench. The first oxide within the termination trench is thicker than the third oxide within the core trench.

20 Claims, 12 Drawing Sheets

(56) References Cited

U.S. PATENT DOCUMENTS

| | | | | |
|---|---|---|---|---|
| 4,593,302 A | | 6/1986 | Lidow et al. | |
| 4,602,266 A | | 7/1986 | Coe | |
| 4,620,211 A | | 10/1986 | Baliga et al. | |
| 4,646,117 A | | 2/1987 | Temple | |
| 4,680,853 A | | 7/1987 | Lidow et al. | |
| 4,710,265 A | | 12/1987 | Hotta | |
| 4,803,532 A | | 2/1989 | Mihara | |
| 4,819,044 A | | 4/1989 | Murakami | |
| 4,819,052 A | | 4/1989 | Hutter | |
| 4,941,026 A | | 7/1990 | Temple | |
| 4,954,854 A | | 9/1990 | Dhong et al. | |
| 4,974,059 A | | 11/1990 | Kinzer | |
| 4,982,249 A | | 1/1991 | Kim et al. | |
| 5,016,066 A | | 5/1991 | Takahashi | |
| 5,019,526 A | | 5/1991 | Yamane et al. | |
| 5,034,338 A | | 7/1991 | Neppl et al. | |
| 5,034,346 A | | 7/1991 | Alter et al. | |
| 5,072,266 A | | 12/1991 | Bulucea et al. | |
| 5,086,007 A | | 2/1992 | Ueno | |
| 5,087,577 A | | 2/1992 | Strack | |
| 5,113,237 A | | 5/1992 | Stengl | |
| 5,156,993 A | | 10/1992 | Su | |
| 5,160,491 A | | 11/1992 | Mori | |
| 5,168,331 A | | 12/1992 | Yilmaz | |
| 5,171,699 A | | 12/1992 | Hutter et al. | |
| 5,233,215 A | | 8/1993 | Baliga | |
| 5,250,449 A | | 10/1993 | Kuroyanagi et al. | |
| 5,268,586 A | | 12/1993 | Mukherjee et al. | |
| 5,298,442 A | | 3/1994 | Bulucea et al. | |
| 5,316,959 A | | 5/1994 | Kwan et al. | |
| 5,341,011 A | | 8/1994 | Hshieh et al. | |
| 5,362,665 A | | 11/1994 | Lu | |
| 5,378,655 A | | 1/1995 | Hutchings et al. | |
| 5,396,085 A | | 3/1995 | Baliga | |
| 5,404,040 A | | 4/1995 | Hshieh et al. | |
| 5,422,508 A | | 6/1995 | Yilmaz et al. | |
| 5,429,964 A | | 7/1995 | Yilmaz et al. | |
| 5,497,013 A | | 3/1996 | Temple | |
| 5,521,409 A | | 5/1996 | Hshieh et al. | |
| 5,578,508 A | | 11/1996 | Baba et al. | |
| 5,597,765 A | | 1/1997 | Yilmaz et al. | |
| 5,614,751 A | | 3/1997 | Yilmaz et al. | |
| 6,228,700 B1 | | 5/2001 | Lee | |
| 6,274,904 B1 | | 8/2001 | Tihanyi | |
| 6,465,843 B1 | | 10/2002 | Hirler et al. | |
| 6,489,204 B1 | | 12/2002 | Tsui | |
| 6,620,691 B2 * | | 9/2003 | Hshieh et al. | 438/270 |
| 6,794,239 B2 | | 9/2004 | Gonzalez | |
| 6,831,345 B2 | | 12/2004 | Kinoshita et al. | |
| 6,927,451 B1 | | 8/2005 | Darwish | |
| 7,045,857 B2 | | 5/2006 | Darwish et al. | |
| 7,122,875 B2 | | 10/2006 | Hatade | |
| 7,161,209 B2 | | 1/2007 | Saito et al. | |
| 7,224,022 B2 | | 5/2007 | Tokano et al. | |
| 7,319,256 B1 * | | 1/2008 | Kraft et al. | 257/330 |
| 7,335,946 B1 | | 2/2008 | Bhalla et al. | |
| 7,348,235 B2 | | 3/2008 | Fujiishi | |
| 7,449,354 B2 | | 11/2008 | Marchant et al. | |
| 7,504,307 B2 | | 3/2009 | Peake | |
| 7,704,864 B2 | | 4/2010 | Hshieh | |
| 7,745,883 B2 | | 6/2010 | Williams et al. | |
| 7,910,486 B2 | | 3/2011 | Yilmaz et al. | |
| 7,911,020 B2 | | 3/2011 | Niimura et al. | |
| 7,964,913 B2 | | 6/2011 | Darwish | |
| 8,076,718 B2 | | 12/2011 | Takaya et al. | |
| 8,247,296 B2 * | | 8/2012 | Grivna | 438/270 |
| 8,334,566 B2 * | | 12/2012 | Tai | 257/330 |
| 8,536,003 B2 | | 9/2013 | Lin et al. | |
| 8,536,004 B2 | | 9/2013 | Lin et al. | |
| 8,541,278 B2 | | 9/2013 | Lin et al. | |
| 8,541,834 B2 | | 9/2013 | Nozu | |
| 8,558,309 B2 | | 10/2013 | Tamaki et al. | |
| 8,564,088 B2 | | 10/2013 | Schmidt | |
| 8,575,707 B2 | | 11/2013 | Tamaki et al. | |
| 8,598,657 B2 | | 12/2013 | Tamaki et al. | |
| 8,603,879 B2 | | 12/2013 | Lin et al. | |
| 8,643,056 B2 | | 2/2014 | Kimura et al. | |
| 8,643,089 B2 | | 2/2014 | Lee et al. | |
| 8,669,614 B2 | | 3/2014 | Cheng | |
| 8,716,789 B2 | | 5/2014 | Ono et al. | |
| 8,748,973 B2 | | 6/2014 | Lin et al. | |
| 8,749,017 B2 | | 6/2014 | Lu | |
| 8,772,869 B2 | | 7/2014 | Saito et al. | |
| 8,786,046 B2 | | 7/2014 | Tamaki et al. | |
| 8,790,971 B1 | | 7/2014 | Lin et al. | |
| 8,796,787 B2 | | 8/2014 | Tamaki et al. | |
| 8,803,207 B2 | | 8/2014 | Grebs et al. | |
| 8,836,017 B2 | | 9/2014 | Lee et al. | |
| 8,847,305 B2 | | 9/2014 | Toyoda et al. | |
| 8,860,144 B2 | | 10/2014 | Ohta et al. | |
| 8,940,606 B2 | | 1/2015 | Lin et al. | |
| 8,963,260 B2 | | 2/2015 | Lin et al. | |
| 8,981,469 B2 | | 3/2015 | Tamaki et al. | |
| 8,987,819 B2 | | 3/2015 | Tamaki et al. | |
| 9,000,516 B2 | | 4/2015 | Xiao | |
| 9,006,822 B2 | | 4/2015 | Peake et al. | |
| 9,041,070 B2 | | 5/2015 | Eguchi et al. | |
| 9,041,101 B2 | | 5/2015 | Ono et al. | |
| 9,048,250 B2 | | 6/2015 | Yamada et al. | |
| 9,076,725 B2 | | 7/2015 | Niimura | |
| 9,076,887 B2 | | 7/2015 | Lee et al. | |
| 9,082,810 B2 | | 7/2015 | Kitagawa | |
| 9,093,288 B2 | | 7/2015 | Tamaki et al. | |
| 9,111,770 B2 | | 8/2015 | Lin et al. | |
| 9,129,892 B2 | | 9/2015 | Toyoda et al. | |
| 9,136,324 B2 | | 9/2015 | Kimura et al. | |
| 9,136,325 B2 | | 9/2015 | Tan et al. | |
| 9,166,036 B2 | | 10/2015 | Tamaki | |
| 9,236,460 B2 | | 1/2016 | Koyama et al. | |
| 9,240,464 B2 | | 1/2016 | Eguchi et al. | |
| 9,269,767 B2 | | 2/2016 | Tamaki et al. | |
| 9,281,393 B2 | | 3/2016 | Ma et al. | |
| 9,293,564 B2 | | 3/2016 | Nishimura et al. | |
| 9,306,064 B2 | | 4/2016 | Wahl et al. | |
| 9,312,332 B2 | | 4/2016 | Lu | |
| 9,349,721 B2 | | 5/2016 | Saito et al. | |
| 9,362,118 B2 | | 6/2016 | Toyoda et al. | |
| 9,368,617 B2 | | 6/2016 | Hirler et al. | |
| 9,379,235 B2 | | 6/2016 | Tamaki et al. | |
| 9,425,306 B2 | | 8/2016 | Gao et al. | |
| 9,431,249 B2 | | 8/2016 | Pattanayak | |
| 9,431,290 B2 | | 8/2016 | Niimura | |
| 9,431,550 B2 | | 8/2016 | Chen et al. | |
| 9,437,424 B2 | | 9/2016 | Pattanayak et al. | |
| 9,443,974 B2 | | 9/2016 | Gao et al. | |
| 2001/0026989 A1 | | 10/2001 | Thapar | |
| 2001/0050394 A1 | | 12/2001 | Onishi et al. | |
| 2002/0016034 A1 | | 2/2002 | Gonzalez | |
| 2002/0030237 A1 * | | 3/2002 | Omura et al. | 257/397 |
| 2002/0123196 A1 | | 9/2002 | Chang et al. | |
| 2003/0011046 A1 | | 1/2003 | Qu | |
| 2003/0085422 A1 * | | 5/2003 | Amali et al. | 257/329 |
| 2003/0193067 A1 | | 10/2003 | Kim et al. | |
| 2004/0021173 A1 * | | 2/2004 | Sapp | 257/330 |
| 2004/0021174 A1 | | 2/2004 | Kobayashi | |
| 2004/0113201 A1 | | 6/2004 | Bhalla et al. | |
| 2004/0222458 A1 * | | 11/2004 | Hsieh et al. | 257/329 |
| 2004/0222461 A1 | | 11/2004 | Peyre-Lavigne et al. | |
| 2005/0062124 A1 | | 3/2005 | Chiola | |
| 2005/0215011 A1 | | 9/2005 | Darwish et al. | |
| 2006/0014349 A1 | | 1/2006 | Williams et al. | |
| 2006/0113577 A1 | | 6/2006 | Ohtani | |
| 2006/0209887 A1 * | | 9/2006 | Bhalla et al. | 370/466 |
| 2006/0214242 A1 | | 9/2006 | Carta et al. | |
| 2006/0267090 A1 | | 11/2006 | Sapp et al. | |
| 2006/0273390 A1 | | 12/2006 | Hshieh et al. | |
| 2007/0040217 A1 | | 2/2007 | Saito et al. | |
| 2007/0155104 A1 | | 7/2007 | Marchant et al. | |
| 2007/0290257 A1 * | | 12/2007 | Kraft et al. | 257/330 |
| 2008/0042172 A1 | | 2/2008 | Hirler et al. | |
| 2008/0090347 A1 | | 4/2008 | Huang et al. | |
| 2008/0185643 A1 | | 8/2008 | Hossain | |
| 2008/0197407 A1 * | | 8/2008 | Challa et al. | 257/330 |
| 2008/0211020 A1 | | 9/2008 | Saito | |

(56) References Cited

U.S. PATENT DOCUMENTS

| | | |
|---|---|---|
| 2008/0290403 A1 | 11/2008 | Ono et al. |
| 2009/0020810 A1* | 1/2009 | Marchant ............... 257/331 |
| 2009/0079002 A1 | 3/2009 | Lee et al. |
| 2009/0085099 A1 | 4/2009 | Su et al. |
| 2009/0090967 A1 | 4/2009 | Chen et al. |
| 2009/0166721 A1 | 7/2009 | Denison et al. |
| 2009/0206440 A1 | 8/2009 | Schulze et al. |
| 2009/0315104 A1* | 12/2009 | Hsieh ..................... 257/330 |
| 2010/0006935 A1 | 1/2010 | Huang et al. |
| 2010/0032791 A1 | 2/2010 | Hozumi et al. |
| 2010/0078775 A1 | 4/2010 | Mauder et al. |
| 2010/0084704 A1 | 4/2010 | Darwish et al. |
| 2010/0233667 A1* | 9/2010 | Wilson et al. ............ 434/362 |
| 2010/0289032 A1 | 11/2010 | Zhang et al. |
| 2010/0311216 A1 | 12/2010 | Marchant |
| 2011/0001189 A1* | 1/2011 | Challa et al. ............ 257/341 |
| 2011/0089486 A1 | 4/2011 | Xu et al. |
| 2011/0089488 A1 | 4/2011 | Yilmaz et al. |
| 2011/0233667 A1* | 9/2011 | Tai et al. ................ 257/334 |
| 2011/0254084 A1 | 10/2011 | Terrill et al. |
| 2012/0112306 A1 | 5/2012 | Onishi |
| 2012/0299094 A1 | 11/2012 | Lee et al. |
| 2013/0069145 A1* | 3/2013 | Kawano et al. .......... 257/330 |
| 2013/0140633 A1 | 6/2013 | Pattanayak |
| 2013/0187196 A1* | 7/2013 | Kadow .................... 257/140 |
| 2013/0214355 A1 | 8/2013 | Fang et al. |
| 2013/0264650 A1 | 10/2013 | Tamaki et al. |
| 2013/0277763 A1 | 10/2013 | Ohta et al. |
| 2013/0320462 A1 | 12/2013 | Tipirneni et al. |
| 2013/0334598 A1 | 12/2013 | Okumura |
| 2014/0027842 A1 | 1/2014 | Tamaki et al. |
| 2014/0027847 A1 | 1/2014 | Tamaki et al. |
| 2014/0035002 A1 | 2/2014 | Cao et al. |
| 2014/0061644 A1 | 3/2014 | Cao et al. |
| 2014/0061783 A1 | 3/2014 | Xiao |
| 2014/0110779 A1 | 4/2014 | Tamaki |
| 2014/0117445 A1 | 5/2014 | Kimura et al. |
| 2014/0159143 A1 | 6/2014 | Ma et al. |
| 2014/0191309 A1 | 7/2014 | Eguchi et al. |
| 2014/0191310 A1 | 7/2014 | Ono et al. |
| 2014/0199816 A1 | 7/2014 | Lin et al. |
| 2014/0206162 A1 | 7/2014 | Eguchi et al. |
| 2014/0242769 A1 | 8/2014 | Yamada et al. |
| 2014/0284704 A1 | 9/2014 | Saito et al. |
| 2014/0291773 A1 | 10/2014 | Lin et al. |
| 2014/0299961 A1 | 10/2014 | Tamaki et al. |
| 2014/0302621 A1 | 10/2014 | Niimura |
| 2014/0312418 A1 | 10/2014 | Tamaki et al. |
| 2014/0327039 A1 | 11/2014 | Lin et al. |
| 2014/0370674 A1 | 12/2014 | Toyoda et al. |
| 2015/0054062 A1 | 2/2015 | Lin et al. |
| 2015/0054119 A1 | 2/2015 | Tan et al. |
| 2015/0076599 A1 | 3/2015 | Cho et al. |
| 2015/0097237 A1 | 4/2015 | Tamaki et al. |
| 2015/0115286 A1 | 4/2015 | Takeuchi et al. |
| 2015/0115355 A1 | 4/2015 | Hirler et al. |
| 2015/0115358 A1 | 4/2015 | Mauder et al. |
| 2015/0116031 A1 | 4/2015 | Wahl et al. |
| 2015/0137697 A1 | 5/2015 | Cheng |
| 2015/0155378 A1 | 6/2015 | Tamaki et al. |
| 2015/0179764 A1 | 6/2015 | Okumura |
| 2015/0187913 A1 | 7/2015 | Peake et al. |
| 2015/0249124 A1 | 9/2015 | Ma et al. |
| 2015/0270157 A1 | 9/2015 | Niimura |
| 2015/0287778 A1 | 10/2015 | Tamaki et al. |
| 2015/0340231 A1 | 11/2015 | Toyoda et al. |
| 2015/0364577 A1 | 12/2015 | Nishimura et al. |
| 2016/0020273 A1 | 1/2016 | Woo et al. |
| 2016/0020276 A1 | 1/2016 | Lu |
| 2016/0020315 A1 | 1/2016 | Hirler |
| 2016/0035880 A1 | 2/2016 | Tamaki |
| 2016/0049466 A1 | 2/2016 | Abiko et al. |
| 2016/0079079 A1 | 3/2016 | Eguchi et al. |
| 2016/0079411 A1 | 3/2016 | Hino et al. |
| 2016/0126345 A1 | 5/2016 | Tamaki et al. |
| 2016/0133505 A1 | 5/2016 | Eguchi et al. |
| 2016/0190235 A1 | 6/2016 | Tamaki et al. |
| 2016/0225893 A1 | 8/2016 | Hirler et al. |

FOREIGN PATENT DOCUMENTS

| | | |
|---|---|---|
| DE | 10343084 | 5/2005 |
| DE | 10 2004 057 792 | 6/2006 |
| DE | 112006003618 T5 | 11/2008 |
| DE | 10 2008 032 711 | 1/2009 |
| DE | 10 2009 036 930 | 3/2010 |
| EP | 0227894 | 7/1987 |
| EP | 0279403 A2 | 8/1988 |
| EP | 0310047 A2 | 4/1989 |
| EP | 0 345 380 | 12/1989 |
| EP | 0 580 213 | 1/1994 |
| EP | 0 583 023 | 2/1994 |
| EP | 0 620 588 | 10/1994 |
| FR | 2 647 596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| JP | 56-58267 | 5/1981 |
| JP | 59-84474 | 5/1984 |
| JP | 59-141267 | 8/1984 |
| JP | 60-249367 | 12/1985 |
| JP | 61-80860 | 4/1986 |
| JP | 62-176168 | 8/1987 |
| JP | 1-42177 | 2/1989 |
| JP | 1-198076 | 8/1989 |
| JP | 1-310576 | 12/1989 |
| JP | 2-91976 | 3/1990 |
| JP | H02-114646 | 4/1990 |
| JP | 3273180 | 4/2002 |
| JP | 2002-127830 | 5/2002 |
| JP | 2002-540603 | 11/2002 |
| JP | 2003-101039 | 4/2003 |
| JP | 2003-179223 | 6/2003 |
| JP | 2005-209983 | 8/2005 |
| JP | 2005-286328 | 10/2005 |
| JP | 2006-005275 | 1/2006 |
| JP | 2006-128507 | 5/2006 |
| JP | 2006-310782 | 11/2006 |
| JP | 2007042836 | 2/2007 |
| JP | 2007-157799 | 6/2007 |
| JP | 2007-529115 | 10/2007 |
| JP | 2008-294214 | 12/2008 |
| JP | 2009-117715 | 5/2009 |
| JP | 2010-147065 | 7/2010 |
| JP | 2010-251404 | 11/2010 |
| JP | 2011-003729 | 1/2011 |
| JP | 2011-192824 | 9/2011 |
| JP | 2011-199223 | 10/2011 |
| JP | 2011-204710 | 10/2011 |
| JP | 2012-104577 | 5/2012 |
| KR | 10-2012-0027299 | 3/2012 |
| WO | 2005065385 | 7/2005 |
| WO | 2006027739 | 3/2006 |
| WO | 2007002857 | 1/2007 |
| WO | 2010132144 | 11/2010 |
| WO | 2011050115 | 4/2011 |

OTHER PUBLICATIONS

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367.

P. Ou-Yang, "Double Ion Implanted V-MOS Technology", IEEE Journal of Solid State Circuits, vol. SC-12, No. 1, Feb. 1977, pp. 3-10.

D. Jaume et al, "High-Voltage Planar Devices Using Field Plate and Semi-Resistive Layers", IEEE Trans. on Electron Devices, vol. 38, No. 7, Jul. 1991, pp. 1681-1684.

Baliga, "Modern Power Devices", A Wiley-Interscience Publication, John Wiley & Sons, Inc., 1987, pp. 62-131.

(56) References Cited

OTHER PUBLICATIONS

Barbuscia et al., "Modeling of Polysilicon Dopant Diffusion for Shallow-Junction Bipolar Technology", IEDM, 1984, pp. 757-760, No Month.

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797.

Patent Application As Filed for U.S. Appl. No. 14/663,872; Inventors: Misbah Ul Azam et al.; Filed Mar. 20, 2015; "Mosfet Termination Trench,".

Antognetti, "Power Integrated Circuits: Physics, Design, and Applications," McGraw-Hill Book Co., 1986, pp. 3.14-3.27, Dec.

"SMP6ON06, 60N05, SMP5ON06, 50N05, N-Channel Enhancement Mode Transistors," MOSPOWER Data Book, Siliconix inc., 1988, pp. 4-423—4-426.

Chang et al., "Vertical FET Random-Access Memories With Deep Trench Isolation," IBM Technical Disclosure Bulletin, vol. 22, No. 8B, Jan. 1980, pp. 3683-3687.

Antoniu et al., "Towards Achieving the Soft-Punch-Through Superjunction Insulated-Gate Bipolar Transistor Breakdown Capability," IEEE Electron Device Letters, vol. 32, No. 9, Sep. 2011, pp. 1275-1277.

Jeboy et al., "A new generation of high voltage MOSFETs breaks the limit line of silicon," IEDM '98, Technical Digest International, Dec. 1998, pp. 683-685, IEEE.

A. Q. Huang, "New Unipolar Switching Power Device Figures of Merit," IEEE Electron Device Letters, vol. 25, No. 5, May, 2004, pp. 298-301.

Wamoto et al., "Above 500V class Superjunction MOSFETs fabricated by deep trench etching and epitaxial growth," Proceedings of the 17th International Symposium on Power Semiconductor Devices & ICs, May 23-26 ,2005, pp. 3134, IEEE.

Kim et al.,"New Power Device Figure of Merit for High-Frequency Applications," Proceedings of 1995 International Symposium on Power Semiconductor Devices & ICs, pp. 309-314.

Lorenz et al., "COOLMOS(TM) - a new milestone in high voltage Power MOS," Proceedings of the 11th International Symposium on Power Semiconductor Devices & ICs, 1999, pp. 3-10, IEEE.

Saito et al., "A 20 mΩ • cm2 600V-class Superjunction MOSFET," Proceedings of 2004 International Symposium on Power Semiconductor Devices & ICs, pp. 459-462.

Shenoy et al., "Analysis of the Effect of Charge Imbalance on the Static and Dynamic Characteristics of the Superjunction MOSFET," Proceedings of the 11th International Symposium on Power Semiconductor Devices & ICs, 1999, pp. 99-102, IEEE.

* cited by examiner

MOSFET TERMINATION TRENCH

BACKGROUND

There are different types of metal-oxide semiconductor field-effect transistor (MOSFET) devices. One type of MOSFET devices that are used for drain-to-source breakdown voltage up to 300 volts (V) use a deep trench lined with oxide and filled with conducting polysilicon that is electrically connected to the source electrode. This enables the charge balance of the drift region with the MOS capacitor during forward blocking. These MOS-charged balanced devices are a better alternative to the conventional trench MOSFET devices. In conventional trench MOSFET devices there is a strong localization of electric field in the body region while MOS charge balanced devices are able to achieve precise lateral drift region charge balance. It is pointed out that this charge balance allows for higher drift region doping, which improves the specific on-state resistance (R×A) factor of these devices. MOS charge balanced devices may have different styles of gate control. For example, it can be a separate polysilicon electrode in the same trench, with an insulating layer in between the gate polysilicon and source connected polysilicon, or it can be in a separate shallow trench. It is also possible for the gate to be a planar on top of the silicon surface. However, the conventional edge termination cannot be used to achieve higher desired breakdown voltages due to the high doping density of the epitaxial layer. In trench MOS charge balanced structures, sometimes a simple field plate surrounding the cell array may be sufficient. Nevertheless, as voltage is taken higher and higher the field plate structure begins to show the lower breakdowns due to the incomplete charge balance in the termination area.

SUMMARY

A method, in one embodiment, can include forming a core trench and a termination trench in a substrate. The termination trench is wider than the deep trench in the core cell. In addition, a first oxide can be deposited that fills the core trench and lines the sidewalls and bottom of the termination trench. A first polysilicon can be deposited into the termination trench. A second oxide can be deposited above the first polysilicon. A mask can be deposited above the second oxide and the termination trench. The first oxide can be removed from the core trench. A third oxide can be deposited that lines the sidewalls and bottom of the core trench. The first oxide within the termination trench is thicker than the third oxide within the core trench. This allows the termination trench to support additional voltage, which is blocked by drift region under the trenches in the active area. In one embodiment, the method is applicable for all type of gate controls as explained in the background.

In an embodiment, a semiconductor device can include a termination trench formed in a substrate. The termination trench can include a first oxide that lines the sidewalls and bottom of the termination trench. Also, the termination trench can include a first polysilicon located between the first oxide. The semiconductor device can include a core trench formed in the substrate. The core trench can include a second oxide that lines the sidewalls and bottom of the core trench. Furthermore, the core trench can include a second polysilicon located between the second oxide. The termination trench is wider than the deep trench in the core cell. The first polysilicon is wider than the second polysilicon.

In yet another embodiment, a method can include forming a core trench and a termination trench in a substrate. The termination trench is wider than the deep trench in the core cell. Moreover, a first oxide layer can be deposited that completely fills the trench in the core cell and lines the sidewalls and bottom of the termination trench. A first polysilicon can be deposited into the termination trench. A second oxide layer can be deposited above the first polysilicon. A mask is deposited above the second oxide layer and the termination trench. The first oxide layer can be removed from the deep trench in the core cell. The mask can be removed. A third oxide layer can be deposited that lines the sidewalls and bottom of the deep trench in the core cell. The first oxide layer within the termination trench is thicker than the third oxide layer within the deep trench in the core cell.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings. The drawings referred to in this description should not be understood as being drawn to scale except if specifically noted.

DETAILED DESCRIPTION

Figure 1:
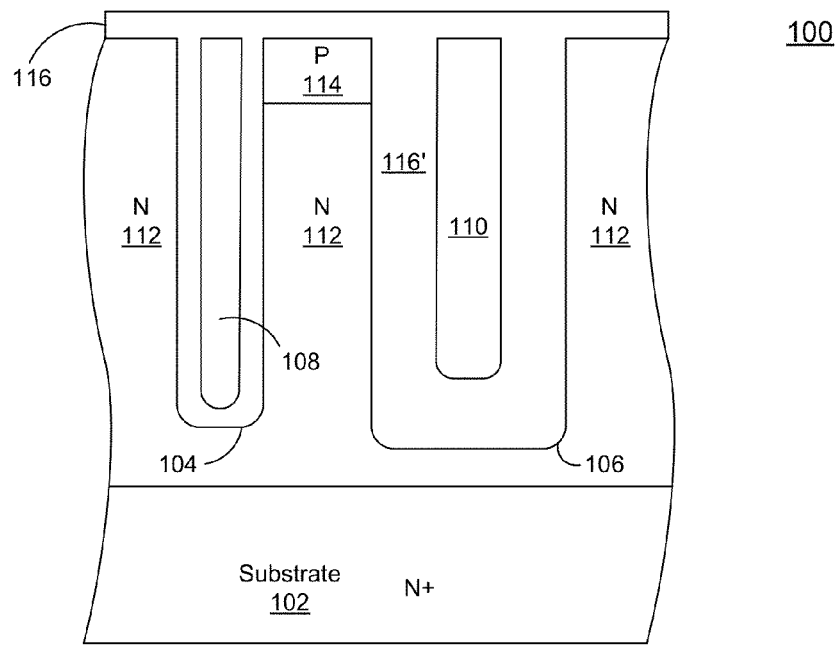
FIG. 1 is a side sectional view of an edge termination area of a semiconductor device in accordance with various embodiments of the invention.

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "removing", "generating," "creating," "forming," "performing," "producing," "depositing," "etching" or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the invention can be implemented in conjunction with these other (perhaps conventional) processes and steps without significantly perturbing them. Generally speaking, embodiments in accordance with the invention can replace portions of a conventional process without significantly affecting peripheral processes and steps.

As used herein, the letter "N" refers to an N-type dopant and the letter "P" refers to a P-type dopant. A plus sign "+" or a minus sign "−" is used to represent, respectively, a relatively high or relatively low concentration of the dopant.

Some of the figures are discussed in the context of one type of device; however, embodiments in accordance with the invention are not so limited. That is, the features described herein can be utilized in either an N-channel device or a P-channel device. For example, the discussion of one type of device can be readily mapped to another type of device by substituting P-type dopant and materials for corresponding N-type dopant and materials, and vice versa.

FIG. 1 is a side sectional view of a semiconductor device 100 that includes a termination trench 106 in accordance with various embodiments of the invention. Note that by implementing the termination trench 106 and the semiconductor device 100 as shown within FIG. 1, the termination trench 106 can advantageously sustain high electric fields and the termination can demonstrate higher and robust drain-to-source breakdown voltage. The semiconductor device 100 can be implemented in a wide variety of ways. For example, the semiconductor device 100 can be implemented as, but is not limited to, a metal-oxide semiconductor field-effect transistor (MOSFET) device, a trench MOS charge balanced MOSFET device, or a Trench Power MOSFET device. In addition, the present embodiment of the semiconductor device 100 is implemented as an N-channel device, but is not limited to such.

In an embodiment, the semiconductor device 100 can include an N+ substrate 102, an N-doped epitaxial region 112, and P-doped region 114. Note that in one embodiment, the N+ substrate 102 and the N-doped epitaxial region 112 can be collectively referred to as a substrate, but are not limited to such. Furthermore, the semiconductor device 100 can also include, but is not limited to, the termination trench 106 along with a core trench 104 which are both formed within the N-doped epitaxial region 112. In one embodiment, the core trench 104 can be referred to as a source core trench, but is not limited to such. It is pointed out that the semiconductor device 100 can include one or more core trenches that are similar and/or different from the core trench 104. Within the present embodiment, the termination trench 106 and the core trench 104 extend through part of the N-doped epitaxial region 112, but are not limited to such. The termination trench 106 and the core trench 104 can each be implemented as a deep trench having a depth within a range of approximately 2-15 microns (or micrometers), but is not limited to such. However, the termination trench 106 and the core trench 104 can be implemented deeper and shallower than the above mentioned range depending on the technology and design constraints. In an embodiment, the termination trench 106 can be implemented to have a greater depth than the core trench 104, but is not limited to such. Moreover, in one embodiment, the width of the termination trench 106 can be implemented to be wider than the width of the core trench 104. For example, the width of the termination trench 106 can be implemented such that it is N times wider, where N>1, than the width of the core trench 104. It is noted that in one embodiment the P-doped region 114 can be grounded, but is not limited to such, to make sure that the N-doped epitaxial region 112 located between the core trench 104 and the termination trench 106 is completely compensated or charge balanced.

Within FIG. 1, the core trench 104 can be lined to include a dielectric layer 116 (e.g., oxide) while also including a conductive region 108 (e.g., polysilicon). The termination trench 106 can be lined to include a thick dielectric layer 116' (e.g., oxide) while also including a thick conductive region 110 (e.g., polysilicon). It is pointed out that the thick dielectric layer 116' can be implemented in a wide variety of ways. For example in one embodiment, the thick dielectric layer 116' can be implemented to be thicker or deeper than the thickness or depth of the dielectric layer 116 located within the core trench 104. In addition, in an embodiment, the thick dielectric layer 116' can be implemented to be N times thicker, where N>1, than the thickness or depth of the dielectric layer 116 located within the core trench 104. It is noted that within the present embodiment, the dielectric layer 116 can cover the conductive regions 108 and 110, which are located within the core trench 104 and the termination trench 106, respectively.

It is pointed out that the dielectric layer 116 and the thick dielectric layer 116' of the semiconductor device 100 can each be implemented in a wide variety of ways. For example in various embodiments, the dielectric layer 116 and the thick dielectric layer 116' can each include, but is not limited to, one or more dielectric materials, one or more oxides, and the like. In one embodiment, the dielectric layer 116 and the thick dielectric layer 116' can each include, but is not limited to, a silicon dioxide.

Within FIG. 1, it is noted that the conductive regions 108 and 110 of the semiconductor device 100 can each be implemented in a wide variety of ways. For example in an embodiment, the conductive regions 108 and 110 can each include, but is not limited to, one or more polysilicon materials.

Note that the semiconductor device 100 may not include all of the elements illustrated by FIG. 1. Additionally, the semiconductor device 100 can be implemented to include one or more elements not illustrated by FIG. 1. It is pointed out that the semiconductor device 100 can be utilized or implemented in any manner similar to that described herein, but is not limited to such.

Figure 2:
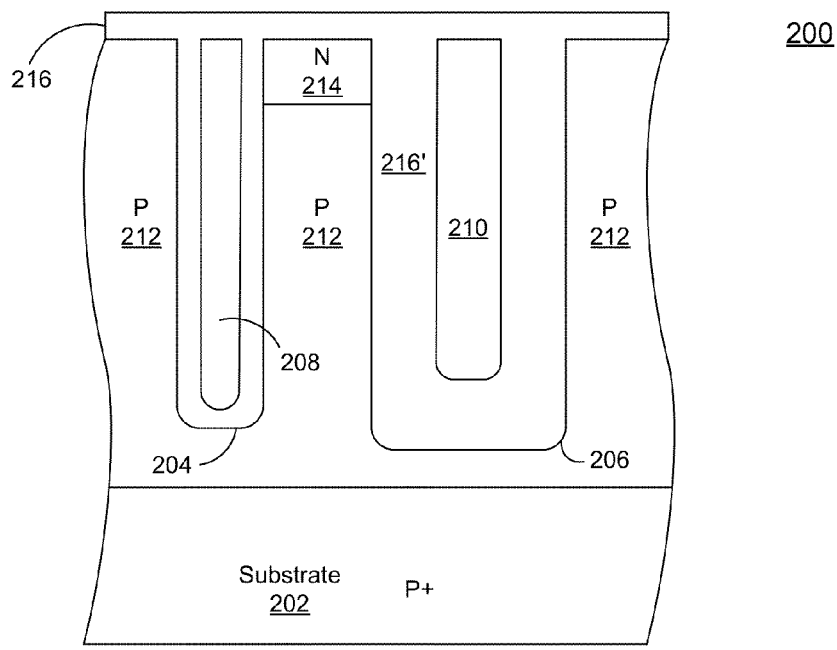
FIG. 2 is a side sectional view of an edge termination area of a semiconductor device in accordance with various embodiments of the invention.

FIG. 2 is a side sectional view of a semiconductor device 200 that includes a termination trench 206 in accordance with various embodiments of the invention. It is pointed out that the semiconductor device 200 of FIG. 2 is similar to the semiconductor device 100 of FIG. 1. However, the main difference is that the present embodiment of the semiconductor device 200 of FIG. 2 is implemented as a P-channel device while the semiconductor device 100 of FIG. 1 is implemented as an N-channel device.

It is noted that by implementing the termination trench 206 and the semiconductor device 200 as shown within FIG. 2, the termination trench 206 can advantageously sustain high electric fields and the termination can demonstrate higher and robust drain-to-source breakdown voltage. The semiconductor device 200 can be implemented in a wide variety of ways. For example, the semiconductor device 200 can be implemented as, but is not limited to, a MOSFET device, a trench MOS charge balanced MOSFET device, or a Trench Power MOSFET device. Moreover, the present embodiment of the semiconductor device 200 is implemented as a P-channel device, but is not limited to such.

In one embodiment, the semiconductor device 200 can include a P+ substrate 202, a P-doped epitaxial region 212, and N-doped region 214. Note that in an embodiment, the P+ substrate 202 and the P-doped epitaxial region 212 can be collectively referred to as a substrate, but are not limited to such. The semiconductor device 200 can also include, but is not limited to, the termination trench 206 along with a core trench 204 which are both formed within the P-doped epitaxial region 212 and the P+ substrate 202. In one embodiment, the core trench 204 can be referred to as a source core trench, but is not limited to such. Note that the semiconductor device 200 can include one or more trenches that are similar and/or different from the core trench 204. Within the present embodiment, the termination trench 206 and the core trench 204 extend through part of the P-doped epitaxial region 212, but are not limited to such. The termination trench 206 and the core trench 204 can each be implemented as a deep trench having a depth within a range of approximately 2-15 microns (or micrometers), but is not limited to such. However, the termination trench 206 and the core trench 204 can be implemented deeper and shallower than the above mentioned range depending on the technology and design constraints. In an embodiment, the termination trench 206 can be implemented to have a greater depth than the core trench 204, but is not limited to such. In addition, in one embodiment, the width of the termination trench 206 can be implemented to be wider than the width of the core trench 204. For example, the width of the termination trench 206 can be implemented such that it is N times wider, where N>1, than the width of the core trench 204. Note that in an embodiment the N-doped region 214 can be grounded to make sure that the P-doped epitaxial region 212 located between the core trench 204 and the termination trench 206 is completely compensated or charge balanced.

Within FIG. 2, the core trench 204 can be lined to include a dielectric layer 216 (e.g., oxide) while also including a conductive region 208 (e.g., polysilicon). The termination trench 206 can be lined to include a thick dielectric layer 216' (e.g., oxide) while also including a thick conductive region 210 (e.g., polysilicon). Note that the thick dielectric layer 216' can be implemented in a wide variety of ways. For example in one embodiment, the thick dielectric layer 216' can be implemented to be thicker or deeper than the thickness or depth of the dielectric layer 216 located within the core trench 204. Moreover, in an embodiment, the thick dielectric layer 216' can be implemented to be N times thicker, where N>1, than the thickness or depth of the dielectric layer 216 located within the core trench 204. Within the present embodiment, the dielectric layer 216 can cover the conductive regions 208 and 210, which are located within the core trench 204 and the termination trench 206, respectively.

It is noted that the dielectric layer 216 and the thick dielectric layer 216' of the semiconductor device 200 can each be implemented in a wide variety of ways. For example in various embodiments, the dielectric layer 216 and the thick dielectric layer 216' can each include, but is not limited to, one or more dielectric materials, one or more oxides, and the like. In one embodiment, the dielectric layer 216 and the thick dielectric layer 216' can each include, but is not limited to, a silicon dioxide.

Within FIG. 2, note that the conductive regions 208 and 210 of the semiconductor device 200 can each be implemented in a wide variety of ways. For example in an embodiment, the conductive regions 208 and 210 can each include, but is not limited to, one or more polysilicon materials.

Note that the semiconductor device 200 may not include all of the elements illustrated by FIG. 2. In addition, the semiconductor device 200 can be implemented to include one or more elements not illustrated by FIG. 2. It is pointed out that the semiconductor device 200 can be utilized or implemented in any manner similar to that described herein, but is not limited to such.

FIGS. 3-16 are side sectional views of selected stages in the fabrication of a semiconductor device including a termination trench in accordance with various embodiments of the invention.

Figure 3:
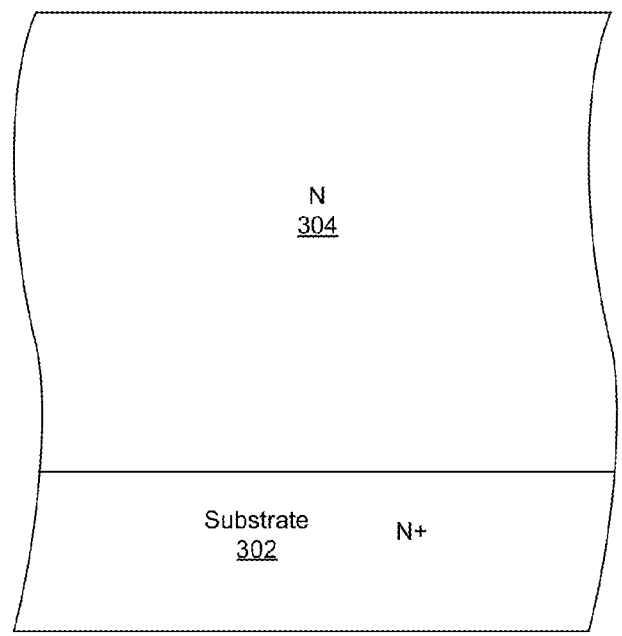
FIGS. 3, 4, 5, 6, 7, 8, 9, 10, 11, 12, 13, 14, 15, and 16 are side sectional views of selected fabrication stages of a semiconductor device including a termination trench in accordance with various embodiments of the invention.

Within FIG. 3, an N-doped epitaxial region 304 can be formed on an N+ substrate 302. It is pointed out that in one embodiment, the N+ substrate 302 and the N-doped epitaxial region 304 can be collectively referred to as a substrate, but are not limited to such.

Figure 4:
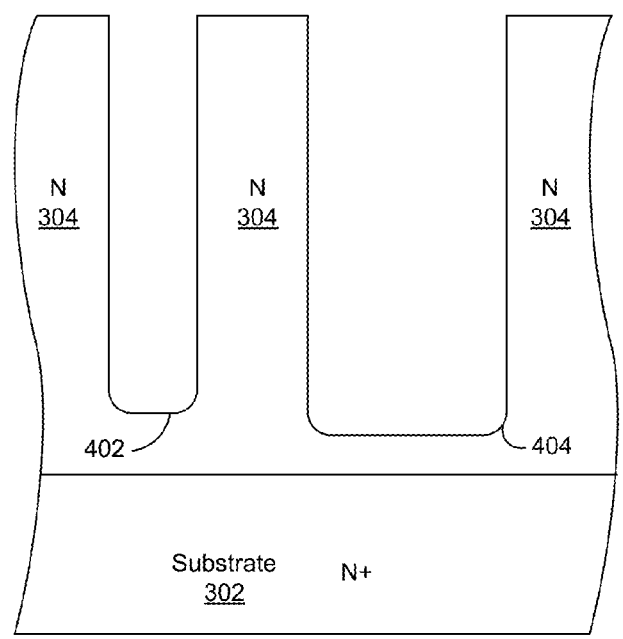

Within FIG. 4, a core trench 402 and a termination trench 404 can be formed or deep etched into the N-doped epitaxial region 304, but are not limited to such. It is noted that in one embodiment the core trench 402 can be referred to as a source core trench 402, but is not limited to such. In addition, one or more core trenches that are similar and/or different to the core trench 402 can be formed or deep etched into the N-doped epitaxial region 304, but are not limited to such. Within the present embodiment, the termination trench 404 and the core trench 402 can each be implemented as a deep trench having a depth within a range of approximately 2-15 microns (or micrometers), but is not limited to such. However, the termination trench 404 and the core trench 402 can be implemented deeper and shallower than the above mentioned range depending on the technology and design constraints. In an embodiment, the termination trench 404 can be implemented to have a depth greater than the core trench 402, but is not limited to such. Furthermore, in one embodiment, the width of the termination trench 404 can be implemented to be wider than the width of the core trench 402. It is pointed out that the core trench 402 and the termination trench 404 can each be implemented in any manner similar to that described herein, but are not limited to such.

Figure 5:
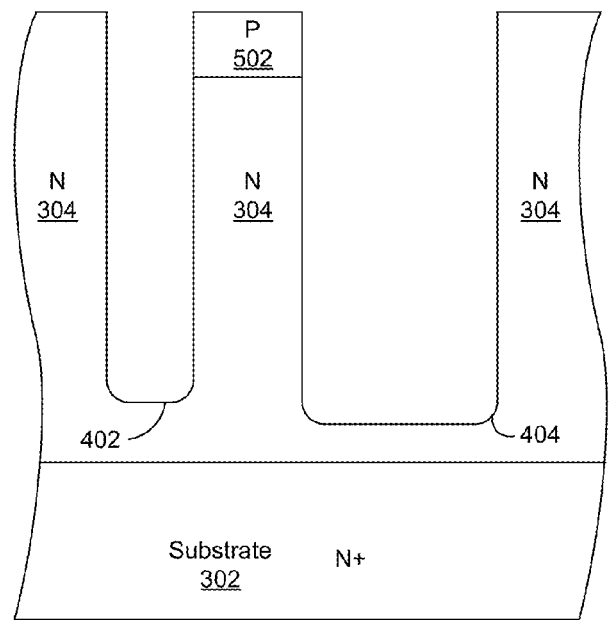

Within FIG. 5, a P-doped region 502 can be implanted into the mesa of the N-doped epitaxial region 304 located between the core trench 402 and the termination trench 404. It is noted that in one embodiment the P-doped region 502 is grounded to make sure that the N-doped epitaxial region 304 located between the core trench 402 and the termination trench 404 is completely compensated or charge balanced.

Figure 6:
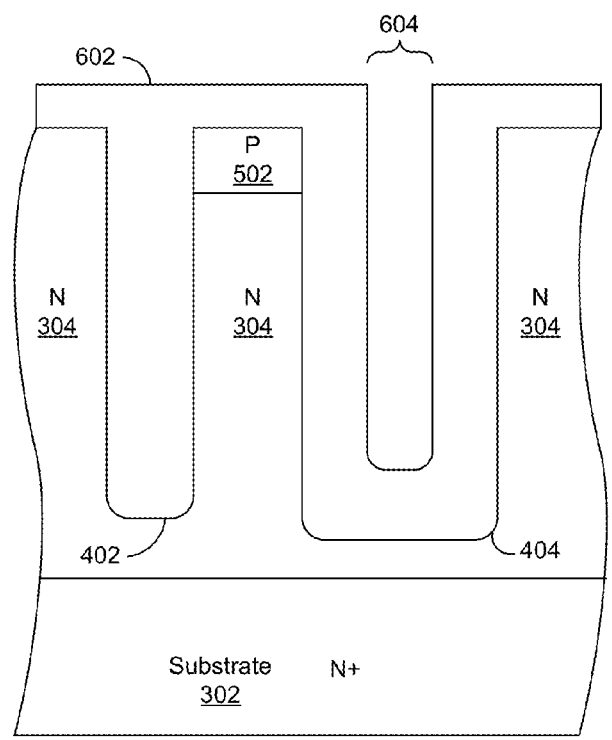

Within FIG. 6, a thick dielectric layer 602 (e.g., oxide) can be deposited above the core trench 402, the termination trench 404, the N-doped epitaxial regions 304, the N+ substrate 302, and the P-doped region 502. For example, in one embodiment, the thick dielectric layer 602 completely fills the core trench 402 and it is deposited on the side walls and bottom of the termination trench 404. As such, the thick dielectric layer 602 creates a gap 604 within the termination trench 404. In one embodiment, the gap 604 can have a width or distance of approximately 1 micrometer (μm), but is not limited to such. Note that in an embodiment the thick dielectric layer 602 can be implemented with one or more dielectric materials, but is not limited to such. In one embodiment, the thick dielectric layer 602 can include, but is not limited to, a silicon dioxide.

Figure 7:
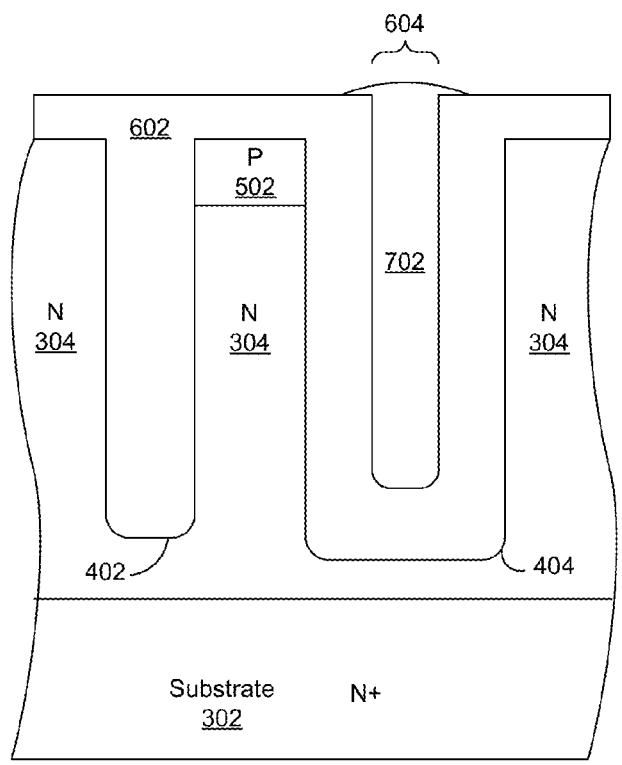

Within FIG. 7, a conductive material 702 (e.g., polysilicon) can be deposited into the termination trench 404. More specifically, in an embodiment, the conductive material 702 can be deposited into the gap 604 formed between the thick oxide layer 602 located on the sidewalls and bottom of the termination trench 404. It is pointed out that in one embodiment the termination trench 404 can be overfilled with the polysilicon 702 (as shown), but is not limited to such.

Figure 8:
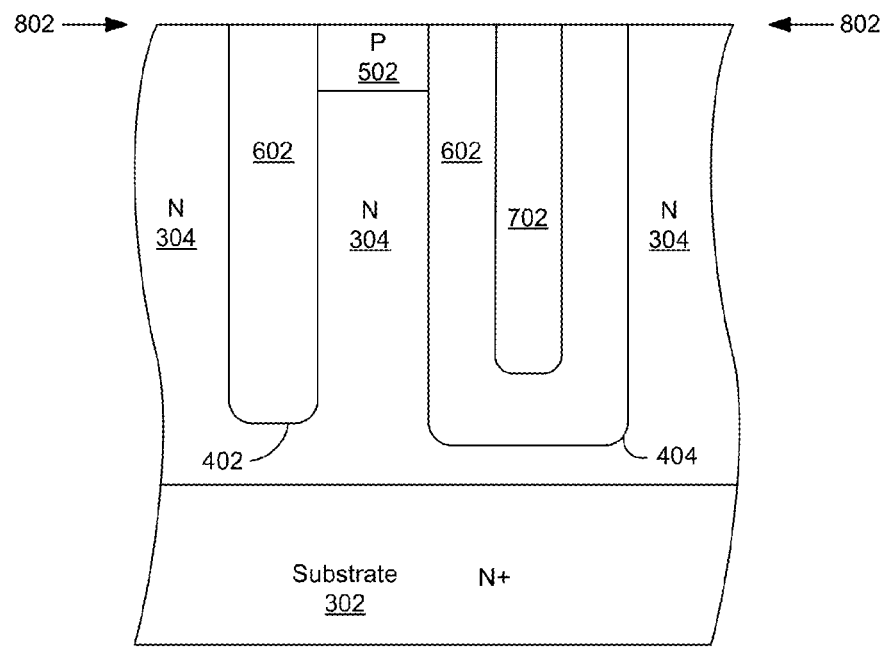

Within FIG. 8, a portion of the conductive material 702 and a portion of the thick dielectric layer 602 can be removed to form a substantially planarized surface 802. It is pointed out that this removal of portions of the conductive material 702 and the thick dielectric layer 602 can be implemented in a wide variety of ways. For example, in an embodiment, a portion of the conductive material 702 can be etched back (e.g., in plasma) so that it is recessed relative to the adjacent thick dielectric layer 602. In addition, a dielectric polishing process, e.g., chemical mechanical polishing (CMP) process or dry/wet etch process, can be used to remove the thick dielectric layer 602 from above the N-doped epitaxial regions 304 and the P-doped region 502 to form the substantially flat and smooth surface 802. Therefore, the exposed surfaces of the thick dielectric 602 located within the core trench 402 along with the conductive material 702 and the thick dielectric layer 602 located within the termination trench 404 are substantially flush with the upper surfaces of the N-doped epitaxial regions 304 and the P-doped region 502.

Figure 9:
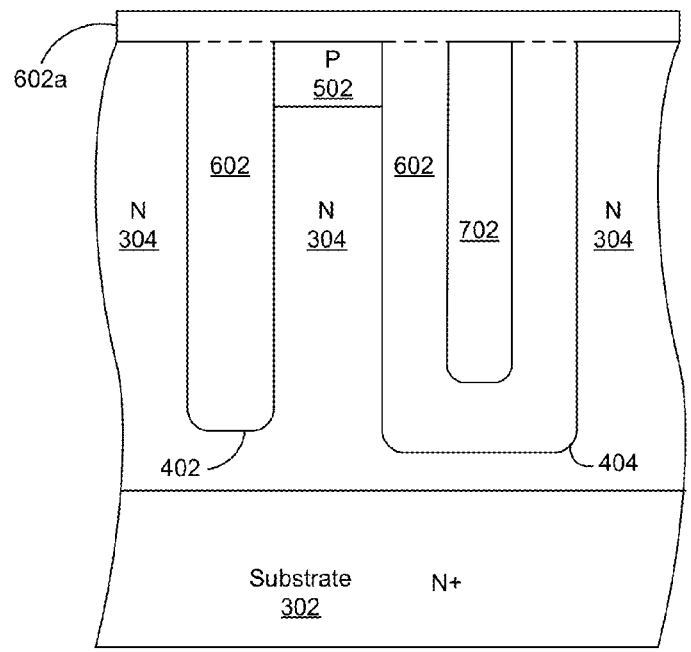

Within FIG. 9, a dielectric layer 602a (e.g., oxide) can be deposited above the N-doped epitaxial regions 304, the P-doped region 502, the thick oxide 602 located within the core trench 402, along with the polysilicon 702 and the thick oxide layer 602 located within the termination trench 404. It is pointed out that in one embodiment the dielectric layer 602a can be implemented with one or more dielectric materials, but is not limited to such. In an embodiment, the dielectric layer 602a can include, but is not limited to, a silicon dioxide.

Figure 10:
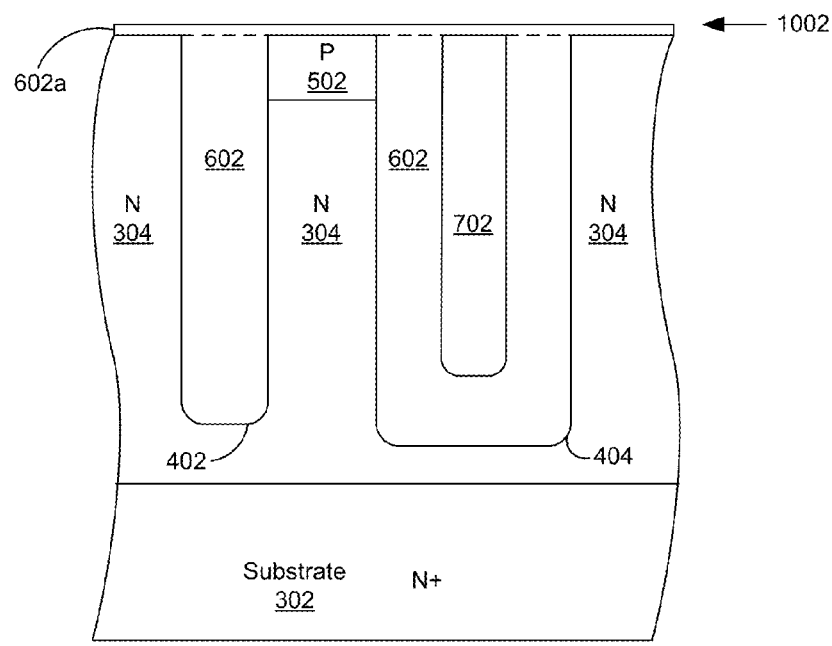

Within FIG. 10, a dielectric polishing process (e.g., CMP) can be performed in order to remove a portion of the dielectric layer 602a such that a thin, smooth, and substantially planarized layer of the dielectric layer 602a remains above the N-doped epitaxial regions 304, the P-doped region 502, the thick dielectric 602 located within the core trench 402, along with the conductive material 702 and the thick dielectric layer 602 located within the termination trench 404. Accordingly, the dielectric polishing process can be used to thin the dielectric layer 602a and form a substantially flat and smooth surface 1002 on the remaining thin dielectric layer 602a.

Figure 11:
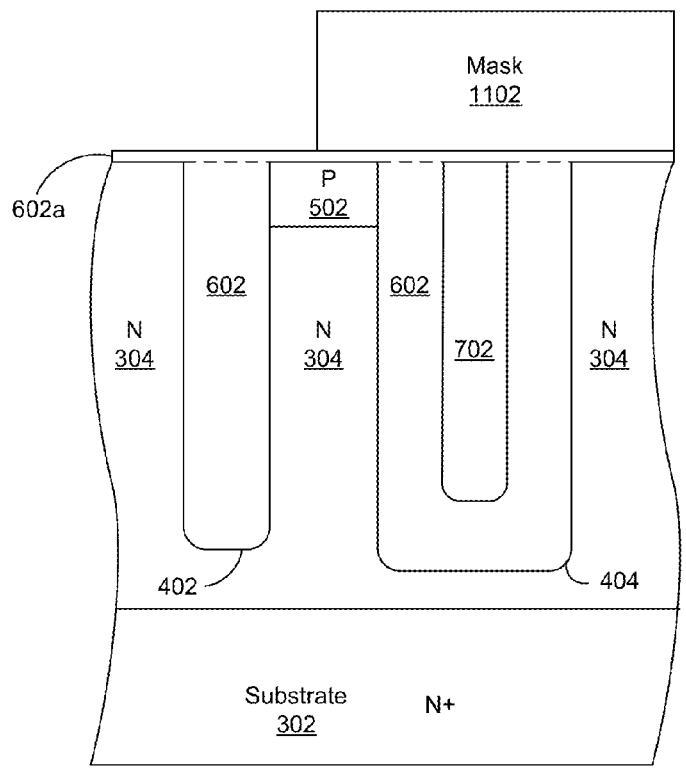

Within FIG. 11, a mask 1102 (e.g., photoresist) can be deposited and developed to cover the termination trench 404 along with a portion of the P-doped region 502 and the N-doped epitaxial region 304 which are both adjacent to the termination trench 404. It is pointed out that in one embodiment the purpose of the mask 1102 is to prevent the removal of any dielectric from within or from above the termination trench 404 during a dielectric etching process. Specifically, in an embodiment, once the mask 1102 is deposited and developed, an etch process (e.g., a buffered oxide etch (BOE)) can be performed to remove the thick dielectric 602 from within the core trench 402 and also remove a portion of the dielectric layer 602a from above the P-doped region 502 and the N-doped epitaxial region 304 which are both adjacent to the core trench 402 as shown in FIG. 12.

Figure 12:
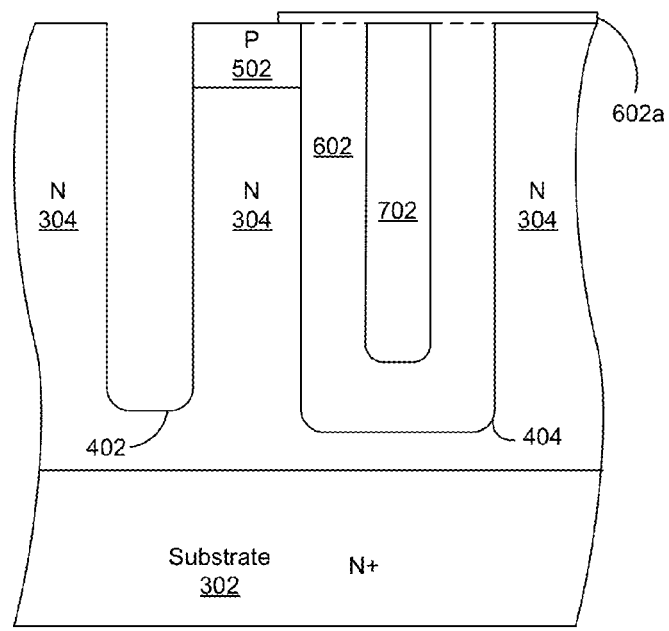

Within FIG. 12, once the etch process has been performed to remove the dielectric as described above in the previous paragraph, a removal process can be performed to remove the mask 1102 from above the dielectric layer 602a and the termination trench 404.

Figure 13:
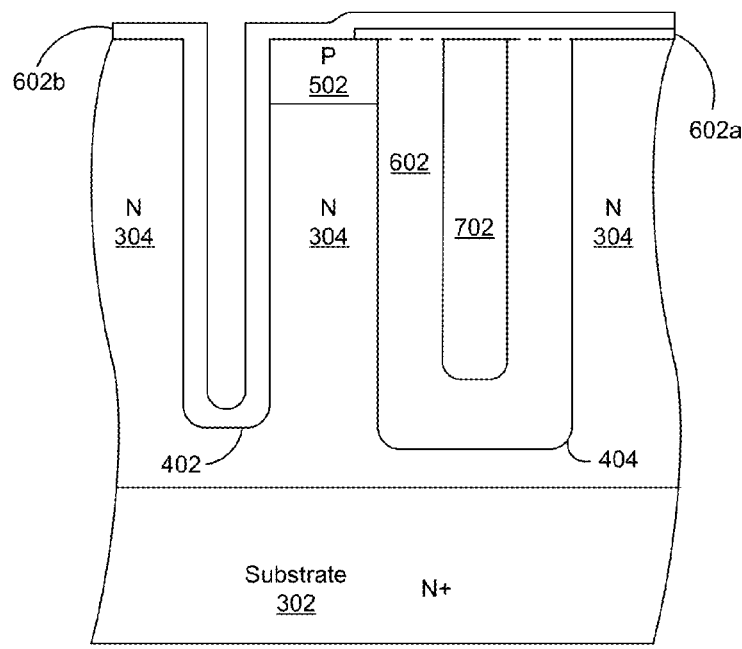

Within FIG. 13, a dielectric layer 602b (e.g., oxide) can be deposited above the core trench 402, the N-doped epitaxial regions 304, the P-doped region 502, and the dielectric layer 602a. Furthermore, it is pointed out that as part of the deposition process, the dielectric layer 602b can be deposited on the sidewalls and bottom of the core trench 402. In one embodiment, note that the dielectric layer 602b can be implemented with one or more dielectric materials, but is not limited to such. In an embodiment, the dielectric layer 602b can include, but is not limited to, a silicon dioxide.

Figure 14:
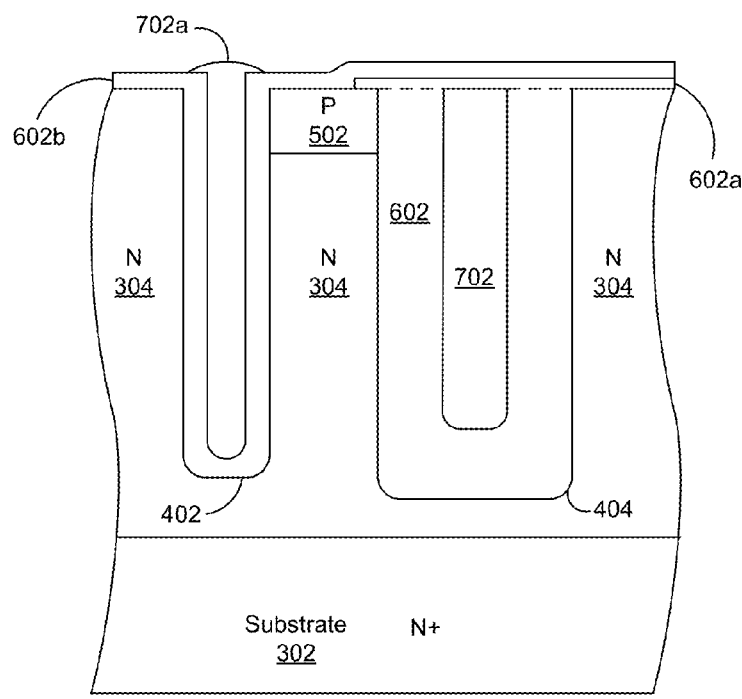

Within FIG. 14, a conductive material 702a (e.g., polysilicon) can be deposited into the core trench 402. Specifically, in an embodiment, the conductive material 702a can be deposited into the gap formed by the dielectric layer 602b located within of the core trench 402. It is noted that the core trench 402 can be overfilled with the conductive material 702a (as shown), but is not limited to such.

Figure 15:
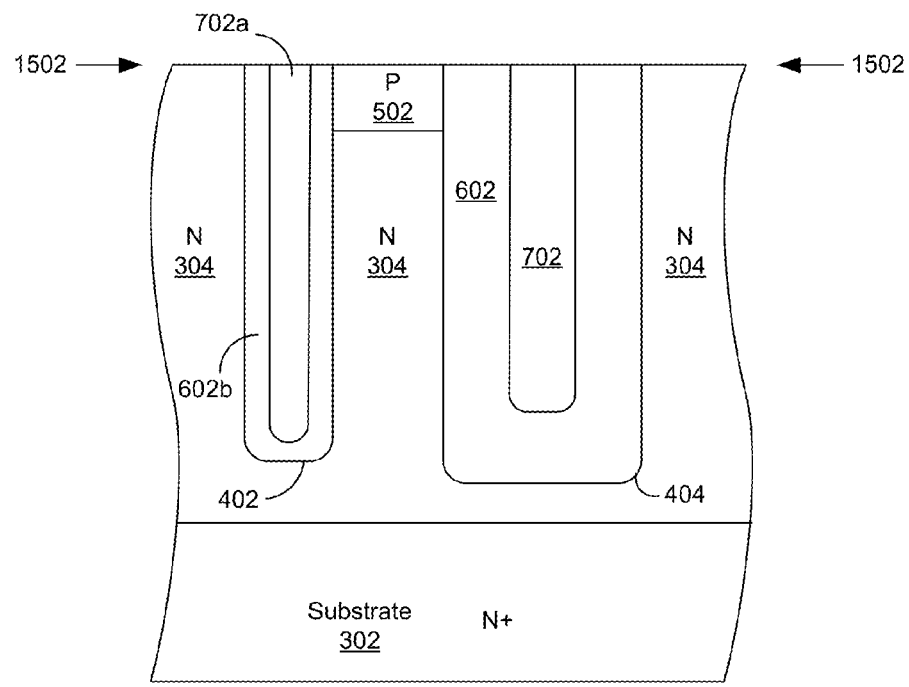

Within FIG. 15, a portion of the conductive material 702a, a portion of the dielectric layer 602b, and dielectric layer 602a can be removed to form a substantially planarized surface 1502. Note that this removal of the dielectric layer 602a along with portions of the polysilicon 702a and the dielectric layer 602b can be implemented in a wide variety of ways. For example, in one embodiment, a portion of the conductive material layer 702a can be etched back (e.g., in plasma) so that it is recessed relative to the adjacent dielectric layer 602b. Additionally, a dielectric polishing process (e.g., CMP) can be used to remove the dielectric layer 602a along with portions of the dielectric layer 602b from above the N-doped epitaxial regions 304 and the P-doped region 502 to form the substantially flat and smooth surface 1502. Accordingly, the exposed surfaces of the conductive material 702a and the dielectric layer 602b located within the core trench 402 along with the conductive material 702 and the thick dielectric layer 602 located within the termination trench 404 are substantially flush with the upper surfaces of the N-doped epitaxial regions 304 and the P-doped region 502.

Figure 16:
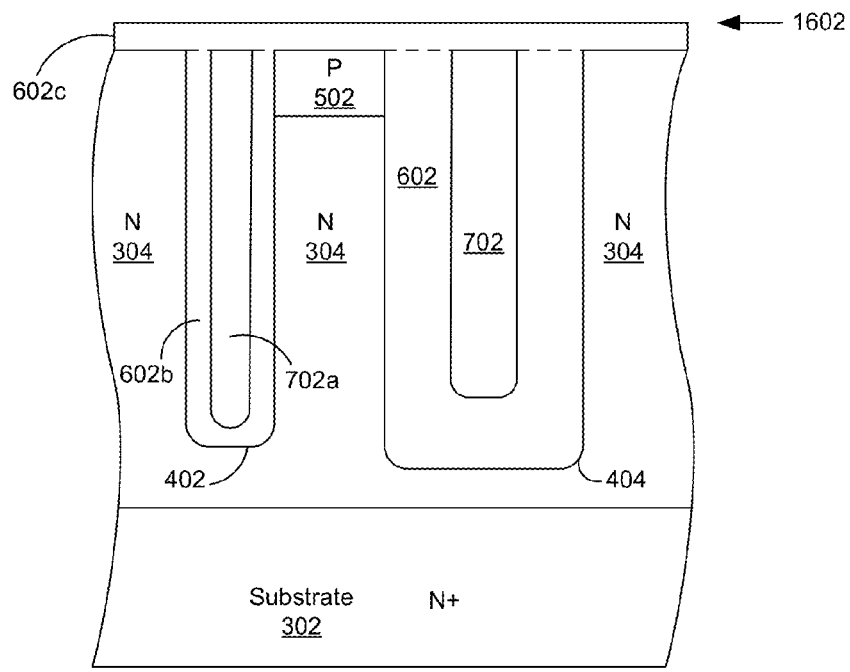

Within FIG. 16, a thick dielectric layer 602c (e.g., oxide) can be deposited above the core trench 402, the termination trench 404, the N-doped epitaxial regions 304, the P-doped region 502, the thick dielectric layer 602, the conductive material 702, the dielectric layer 602b, and the conductive material 702a. Moreover, a dielectric polishing process (e.g., CMP) can be performed to thin and remove a portion of the thick dielectric layer 602c in order to form a substantially planarized and smooth surface 1602. In an embodiment, it is noted that the dielectric layer 602c can be implemented with one or more dielectric materials, but is not limited to such. In one embodiment, the dielectric layer 602c can include, but is not limited to, a silicon dioxide.

Figure 17:
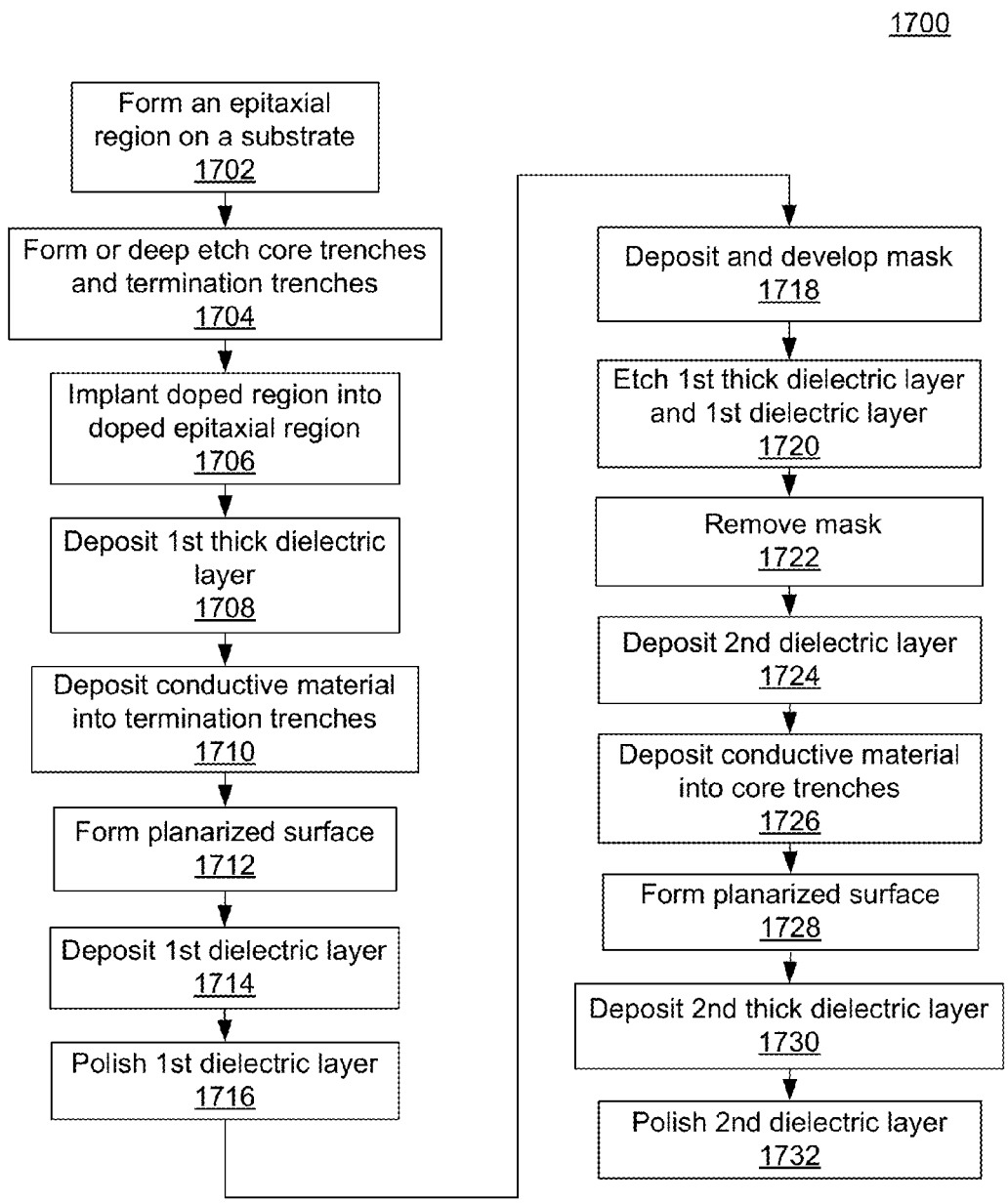
FIG. 17 is flow diagram of a method in accordance with various embodiments of the invention.

FIG. 17 is a flow diagram of a method 1700 in accordance with various embodiments of the invention for fabricating a semiconductor device including a termination trench. Although specific operations are disclosed in FIG. 17, such operations are examples. The method 1700 may not include all of the operations illustrated by FIG. 17. Also, method 1700 may include various other operations and/or variations of the operations shown. Likewise, the sequence of the operations of flow diagram 1700 can be modified. It is appreciated that not all of the operations in flow diagram 1700 may be performed. In various embodiments, one or more of the operations of method 1700 can be controlled or managed by software, by firmware, by hardware, or by any combination thereof, but is not limited to such. Method 1700 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

At operation 1702 of FIG. 17, a doped epitaxial region (e.g., 212 or 304) can be formed on a substrate (e.g., 202 or 302). Note that in one embodiment, the substrate and the doped epitaxial region can be collectively referred to as a substrate, but are not limited to such. It is pointed out that operation 1702 can be implemented in a wide variety of ways. For example, operation 1702 can be implemented in any manner similar to that described herein, but is not limited to such.

At operation 1704, one or more core trenches (e.g., 204 or 402) and one or more termination trenches (e.g., 206 or 404) can be formed or deep etched into the doped epitaxial region or into the doped epitaxial region and the substrate. It is noted that operation 1704 can be implemented in a wide variety of ways. For example in one embodiment, at operation 1704 the one or more core trenches can each be formed or deep etched into the doped epitaxial region or the doped epitaxial region and the substrate. Moreover, in an embodiment, at operation 1704 the one or more termination trenches can each be formed or deep etched into the doped epitaxial region or the doped epitaxial region and the substrate. Operation 1704 can be implemented in any manner similar to that described herein, but is not limited to such.

At operation 1706 of FIG. 17, a doped region (e.g., 214 or 502) can be implanted into a mesa of a doped epitaxial region located between a core trench and a termination trench. Note that operation 1706 can be implemented in a wide variety of ways. For example, operation 1706 can be implemented in any manner similar to that described herein, but is not limited to such.

At operation 1708 of FIG. 17, a first thick dielectric layer (e.g., 216' or 602) can be deposited above the one or more core trenches and the one or more termination trenches. It is noted that operation 1708 can be implemented in a wide variety of ways. For example in an embodiment, the first thick dielectric layer at operation 1708 can be an oxide, but is not limited to such. Operation 1708 can be implemented in any manner similar to that described herein, but is not limited to such.

At operation 1710 of FIG. 17, a conductive material (e.g., 210 or 702) can be deposited into the one or more termination trenches. Note that operation 1710 can be implemented in a wide variety of ways. For example in one embodiment, the conductive material at operation 1710 can be a polysilicon, but is not limited to such. Operation 1710 can be implemented in any manner similar to that described herein, but is not limited to such.

At operation 1712, a portion of the conductive material and a portion of the thick dielectric layer can be removed to form a substantially planarized surface (e.g., 802). It is noted that operation 1712 can be implemented in a wide variety of ways. For example, operation 1712 can be implemented in any manner similar to that described herein, but is not limited to such.

At operation 1714, a first dielectric layer (e.g., 602a) can be deposited above the doped epitaxial regions, the doped region, the one or more core trenches, and the one or more termination trenches. It is pointed out that operation 1714 can be implemented in a wide variety of ways. For example in an embodiment, the first dielectric layer at operation 1714 can be an oxide, but is not limited to such. Operation 1714 can be implemented in any manner similar to that described herein, but is not limited to such.

At operation 1716 of FIG. 17, a polishing process (e.g., CMP) can be performed to remove a portion of the first dielectric layer such that a thin, smooth, and substantially planarized layer of the first dielectric layer remains above the doped epitaxial regions, the doped region, the one or more core trenches, and the one or more termination trenches. It is pointed out that operation 1716 can be implemented in a wide variety of ways. For example, operation 1716 can be implemented in any manner similar to that described herein, but is not limited to such.

At operation 1718, a mask (e.g., 1102) can be deposited and developed to cover each of the one or more termination trenches along with a portion of the doped region and the doped epitaxial region which are both adjacent to each of the one or more termination trenches. Note that operation 1718 can be implemented in a wide variety of ways. For example, operation 1718 can be implemented in any manner similar to that described herein, but is not limited to such.

At operation 1720, an etch (e.g., BOE) can be performed to remove the first thick dielectric from within the one or more core trenches and also remove a portion of the first dielectric layer from above the doped region and the doped epitaxial region which are both adjacent to the core trench. It is pointed out that operation 1720 can be implemented in a wide variety of ways. For example, operation 1720 can be implemented in any manner similar to that described herein, but is not limited to such.

At operation 1722 of FIG. 17, a removal process can be performed to remove each mask from above each of the one or more termination trenches. Note that operation 1722 can be implemented in a wide variety of ways. For example, operation 1722 can be implemented in any manner similar to that described herein, but is not limited to such.

At operation 1724, a second dielectric layer (e.g., 602*b*) can be deposited above each of the one or more core trenches and the first dielectric layer located above the one or more termination trenches. It is noted that operation 1724 can be implemented in a wide variety of ways. For example in one embodiment, the second dielectric layer at operation 1724 can be an oxide, but is not limited to such. Operation 1724 can be implemented in any manner similar to that described herein, but is not limited to such.

At operation 1726 of FIG. 17, a conductive material (e.g., 702*a*) can be deposited into each of the one or more core trenches. It is pointed out that operation 1726 can be implemented in a wide variety of ways. For example in an embodiment, the conductive material at operation 1726 can be a polysilicon, but is not limited to such. Operation 1726 can be implemented in any manner similar to that described herein, but is not limited to such.

At operation 1728, a portion of the conductive material, a portion of the second dielectric layers, and the first dielectric layers can be removed to form a substantially planarized surface (e.g., 1502). It is noted that operation 1728 can be implemented in a wide variety of ways. For example, operation 1728 can be implemented in any manner similar to that described herein, but is not limited to such.

At operation 1730 of FIG. 17, a second thick dielectric layer (e.g., 602*c*) can be deposited above the one or more core trenches and the one or more termination trenches. Note that operation 1730 can be implemented in a wide variety of ways. For example in one embodiment, the second thick dielectric layer at operation 1730 can be an oxide, but is not limited to such. Operation 1730 can be implemented in any manner similar to that described herein, but is not limited to such.

At operation 1732, a polishing process (e.g., CMP) can be performed to thin and remove a portion of the second thick dielectric layer in order to form a substantially planarized and smooth surface (e.g., 1602). It is pointed out that operation 1732 can be implemented in a wide variety of ways. For example, operation 1732 can be implemented in any manner similar to that described herein, but is not limited to such. Once operation 1732 is completed, process 1700 can be ended or exited. In this manner, a semiconductor device including a termination trench can be fabricated in accordance with various embodiments of the invention.

Figure 18:
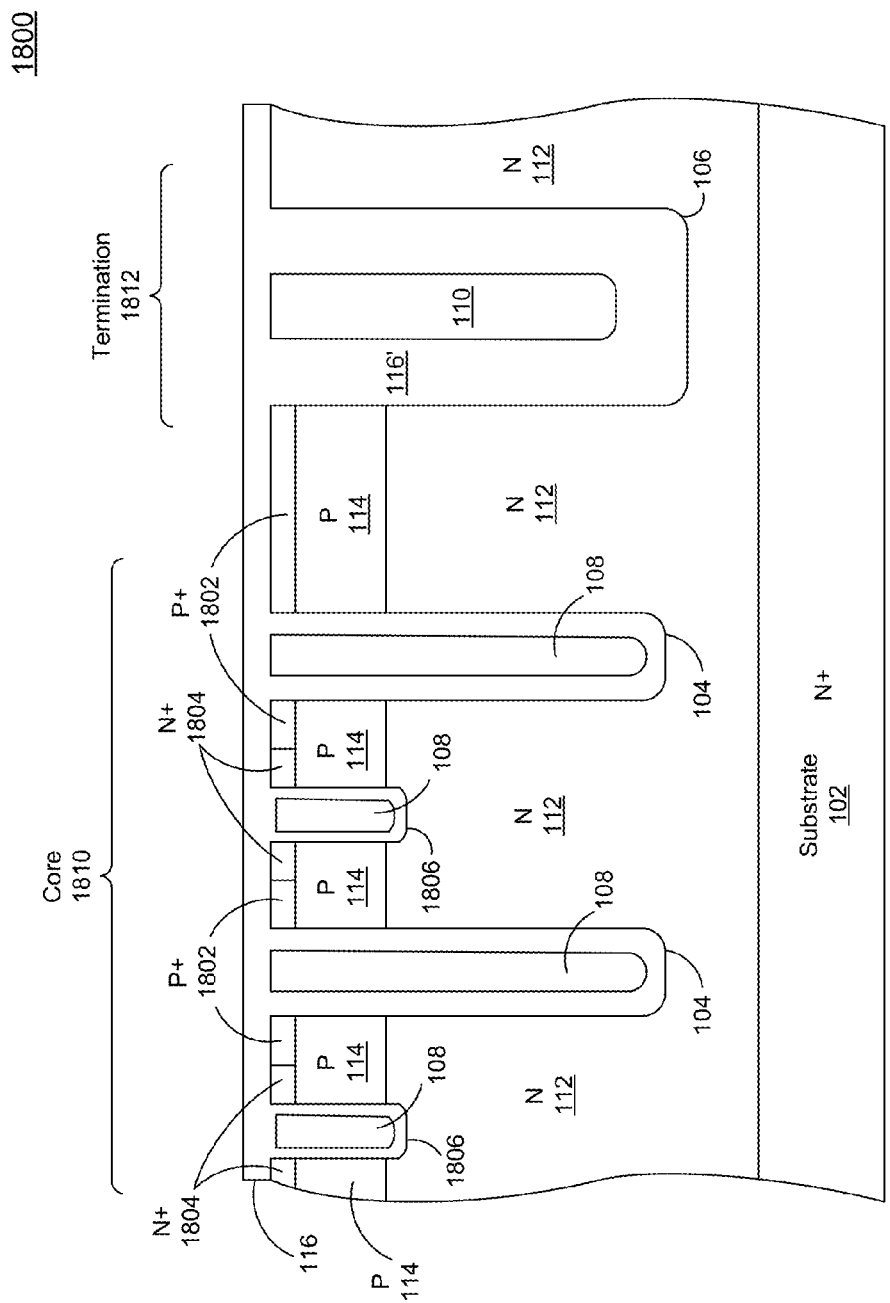
FIG. 18 is a side sectional view of an edge termination area of a semiconductor device in accordance with various embodiments of the invention.

FIG. 18 is a side sectional view of a semiconductor device 1800 that includes a dual trench structure together with termination in accordance with various embodiments of the invention. Note that by implementing a termination trench 106 and the semiconductor device 1800 as shown within FIG. 18, the termination trench 106 and its contents can advantageously sustain high electric fields and the termination can demonstrate higher and robust drain-to-source breakdown voltage. The semiconductor device 1800 can be implemented in a wide variety of ways. For example, the semiconductor device 1800 can be implemented as, but is not limited to, a metal-oxide semiconductor field-effect transistor (MOSFET) device, a trench MOS charge balanced MOSFET device, or a Trench Power MOSFET device. In addition, the present embodiment of the semiconductor device 1800 is implemented as an N-channel device, but is not limited to such.

In an embodiment, the semiconductor device 1800 can include an N+ substrate 102, an N-doped epitaxial region 112, P-doped regions 114, P+ doped regions 1802, and N+ doped regions 1804. Note that in one embodiment, the N+ substrate 102 and the N-doped epitaxial region 112 can be collectively referred to as a substrate, but are not limited to such. Furthermore, the semiconductor device 1800 can also include, but is not limited to, the termination trench 106, core trenches 104, and core trenches 1806 which are formed within the N-doped epitaxial region 112. In one embodiment, the core trenches 104 can be referred to as source core trenches while the core trenches 1806 can be referred to as gate core gate trenches, but are not limited to such. It is pointed out that the semiconductor device 1800 can include one or more core trenches that are similar and/or different from the core trenches 104 and 1806.

Within the present embodiment of FIG. 18, the termination trench 106 and the source core trenches 104 extend through a large portion of the N-doped epitaxial region 112 while the gate core trenches 1806 extend through a smaller portion of the N-doped epitaxial region 112, but are not limited to such. In addition, in the present embodiment, the gate core trenches 1806 can be located between the source core trenches 104. Furthermore, a source core trench 104 in the present embodiment is the trench adjacently located to the termination trench 106.

Note that the termination trench 106 and the core trenches 104 of the semiconductor device 1800 can each be implemented as a deep trench having a depth within a range of approximately 2-15 microns (or micrometers), but is not limited to such. However, the termination trench 106 and the core trenches 104 can be implemented deeper and shallower than the above mentioned range depending on the technology and design constraints. In one embodiment, each gate core trench 1806 is less than half the depth of each source core trench 104, but is not limited to such. As such, the gate core trenches 1806 can be implemented deeper and shallower than shown. In an embodiment, the termination trench 106 can be implemented to have a greater depth than the core trenches 104 and 1806, but is not limited to such. Moreover, in one embodiment, the width of the termination trench 106 can be implemented to be wider than the width of each of the core trenches 104 and 1806. For example, the width of the termination trench 106 can be implemented such that it is at least N times wider, where N>1, than the width of each of the core trenches 104 and 1806. It is pointed out that in one embodiment the P-doped region 114 can be grounded, but is not limited to such, to make sure that the N-doped epitaxial region 112 located between the core trench 104 and the termination trench 106 is completely compensated or charge balanced.

Within FIG. 18, the core trenches 104 and 1806 can each be lined to include a dielectric layer 116 (e.g., oxide) while also including a conductive region 108 (e.g., polysilicon). The termination trench 106 can be lined to include a thick dielectric layer 116' (e.g., oxide) while also including a thick conductive region 110 (e.g., polysilicon). Note that the thick dielectric layer 116' can be implemented in a wide variety of ways. For example in one embodiment, the thick dielectric layer 116' can be implemented to be thicker or deeper than the thickness or depth of the dielectric layer 116 located within the core trenches 104 and 1806. Additionally, in an embodiment, the thick dielectric layer 116' can be implemented to be at least N times thicker, where N>1, than the thickness or depth of the dielectric layer 116 located within the core trenches 104 and 1806. It is pointed out that within the present embodiment, the dielectric layer 116 can cover the conductive regions 108 and 110, which are located within the core trenches 104 and 1806, and the termination trench 106, respectively.

In an embodiment, a P+ doped region 1802 is located above a P-doped region 114 and located between and in contact with the termination trench 106 and a core trench 104. Additionally, the other P+ doped regions 1802 are located above some P-doped regions 114 and in contact with the core trenches 104. Moreover, the N+ doped regions 1804 are located above some P-doped regions 114 and in contact with the core trenches 1806. In one embodiment, the core area 1810 of the semiconductor device 1800 can include, but is not limited to, the core trenches 104 and 1806 and their contents, the N+ doped regions 1804, a portion of the P-doped regions 114, a portion of the P+ doped regions 1802, and a portion of the N-doped epitaxial region 112. In an embodiment, the termination area 1812 of the semiconductor device 1800 can include, but is not limited to, the termination trench 106 and its contents, a portion of the P-doped region 114, a portion of the P+ doped region 1802, and a portion of the N-doped epitaxial region 112.

Within FIG. 18, it is pointed out that the dielectric layer 116 and the thick dielectric layer 116' of the semiconductor device 1800 can each be implemented in a wide variety of ways. For example in one embodiment, the dielectric layer 116 and the thick dielectric layer 116' can each include one or more dielectric materials, but are not limited to such. In an embodiment, the dielectric layer 116 and the thick dielectric layer 116' can each include, but is not limited to, a silicon dioxide. It is noted that the conductive regions 108 and 110 of the semiconductor device 1800 can each be implemented in a wide variety of ways. For example in an embodiment, the conductive regions 108 and 110 can each include, but is not limited to, one or more polysilicon materials.

Note that the semiconductor device 1800 may not include all of the elements illustrated by FIG. 18. Moreover, the semiconductor device 1800 can be implemented to include one or more elements not illustrated by FIG. 18. It is noted that the semiconductor device 1800 can be utilized or implemented in any manner similar to that described herein, but is not limited to such.

Figure 19:
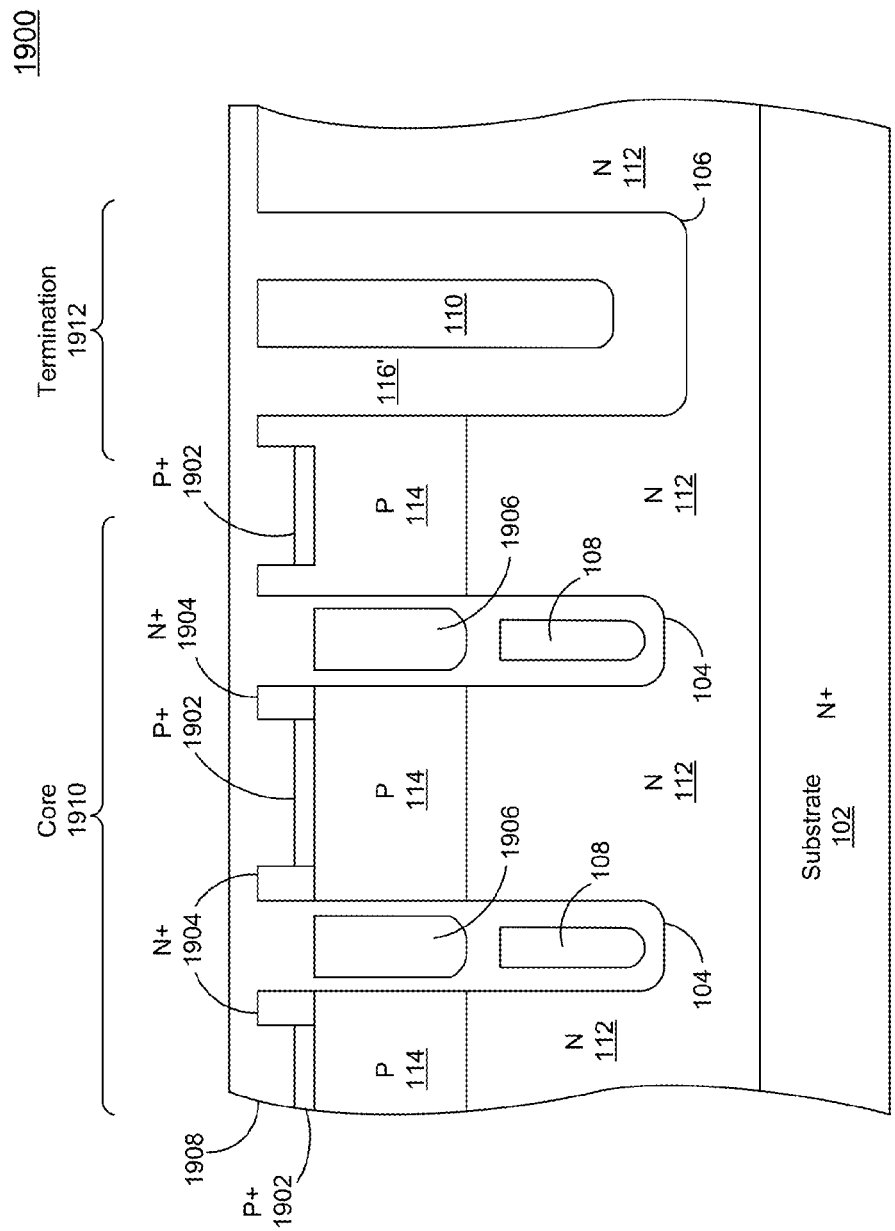
FIG. 19 is a side sectional view of an edge termination area of a semiconductor device in accordance with various embodiments of the invention.

FIG. 19 is a side sectional view of a semiconductor device 1900 that includes a split gate structure together with termination in accordance with various embodiments of the invention. It is noted that by implementing a termination trench 106 and the semiconductor device 1900 as shown within FIG. 19, the termination trench 106 and its contents can advantageously sustain high electric fields and the termination can demonstrate higher and robust drain-to-source breakdown voltage. The semiconductor device 1900 can be implemented in a wide variety of ways. For example, the semiconductor device 1900 can be implemented as, but is not limited to, a metal-oxide semiconductor field-effect transistor (MOSFET) device, a trench MOS charge balanced MOSFET device, or a Trench Power MOSFET device. Additionally, the present embodiment of the semiconductor device 1900 is implemented as an N-channel device, but is not limited to such.

In an embodiment, the semiconductor device 1900 can include an N+ substrate 102, an N-doped epitaxial region 112, P-doped regions 114, P+ doped regions 1902, and N+ doped regions 1904. It is pointed out that in one embodiment, the N+ substrate 102 and the N-doped epitaxial region 112 can be collectively referred to as a substrate, but are not limited to such. Moreover, the semiconductor device 1900 can also include, but is not limited to, the termination trench 106 and core trenches 104 which are formed within the N-doped epitaxial region 112. In one embodiment, the core trenches 104 can be referred to as source/gate core trenches, but are not limited to such. Note that the semiconductor device 1900 can include one or more core trenches that are similar and/or different from the core trenches 104.

Within the present embodiment of FIG. 19, the termination trench 106 and the core trenches 104 extend through a large portion of the N-doped epitaxial region 112, but are not limited to such. Note that the termination trench 106 and the core trenches 104 of the semiconductor device 1900 can each be implemented as a deep trench having a depth within a range of approximately 2-15 microns (or micrometers), but is not limited to such. However, the termination trench 106 and the core trenches 104 can be implemented deeper and shallower than the above mentioned range depending on the technology and design constraints. In an embodiment, the termination trench 106 can be implemented to have a greater depth than the core trenches 104, but is not limited to such. Moreover, in one embodiment, the width of the termination trench 106 can be implemented to be wider than the width of each of the core trenches 104. For example, the width of the termination trench 106 can be implemented such that it is at least N times wider, where N>1, than the width of each of the core trenches 104. It is noted that in one embodiment the P-doped region 114 can be grounded, but is not limited to such, to make sure that the N-doped epitaxial region 112 located between the core trench 104 and the termination trench 106 is completely compensated or charge balanced.

Within FIG. 19, in one embodiment, the core trenches 104 can each be lined to include a dielectric 1908 (e.g., oxide) while also including a source conductive region 108 (e.g., polysilicon) located beneath a gate conductive region 1906 (e.g., polysilicon). In addition, within each core trench 104, the dielectric 1908 is located between the source conductive region 108 and the gate conductive region 1906. The termination trench 106 can be lined to include a thick dielectric layer 116' (e.g., oxide) while also including a thick conductive region 110 (e.g., polysilicon). It is pointed out that the thick dielectric layer 116' can be implemented in a wide variety of ways. For example in an embodiment, the thick dielectric layer 116' can be implemented to be thicker or deeper than the thickness or depth of the dielectric 1908 lining the core trenches 104. In addition, in an embodiment, the thick dielectric layer 116' can be implemented to be at least N times thicker, where N>1, than the thickness or depth of the dielectric layer 1908 located within the core trenches 104. Note that within the present embodiment, the dielectric 1908 can cover the conductive regions 1906 and 110, which are located within the core trenches 104 and the termination trench 106, respectively.

In one embodiment, a P+ doped region 1902 is located above and between a P-doped region 114, which is in contact with the termination trench 106 and a core trench 104. Furthermore, the other P+ doped regions 1902 are located above some P-doped regions 114 and in contact with N+ doped regions 1904. Additionally, the N+ doped regions 1904 are located above some P-doped regions 114 and in contact with the core trenches 104. In an embodiment, the core area 1910 of the semiconductor device 1900 can include, but is not limited to, the core trenches 104 and their contents, the N+ doped regions 1904, a portion of the P-doped regions 114, a portion of the P+ doped regions 1902, and a portion of the N-doped epitaxial region 112. In one embodiment, the termination area 1912 of the semiconductor device 1900 can include, but is not limited to, the termination trench 106 and its contents, a portion of the P-doped region 114, a portion of the P+ doped region 1902, and a portion of the N-doped epitaxial region 112.

Within FIG. 19, note that the dielectric 1908 and the thick dielectric layer 116' of the semiconductor device 1900 can each be implemented in a wide variety of ways. For example in an embodiment, the dielectric 1908 and the thick dielectric layer 116' can each include one or more dielectric materials, but are not limited to such. In one embodiment, the dielectric 1908 and the thick dielectric layer 116' can each include, but is not limited to, a silicon dioxide. It is pointed out that the conductive regions 108, 110, and 1906 of the semiconductor device 1900 can each be implemented in a wide variety of ways. For example in an embodiment, the conductive regions 108, 110, and 1906 can each include, but is not limited to, one or more polysilicon materials.

It is noted that the semiconductor device 1900 may not include all of the elements illustrated by FIG. 19. Furthermore, the semiconductor device 1900 can be implemented to include one or more elements not illustrated by FIG. 19. Note that the semiconductor device 1900 can be utilized or implemented in any manner similar to that described herein, but is not limited to such.

Figure 20:
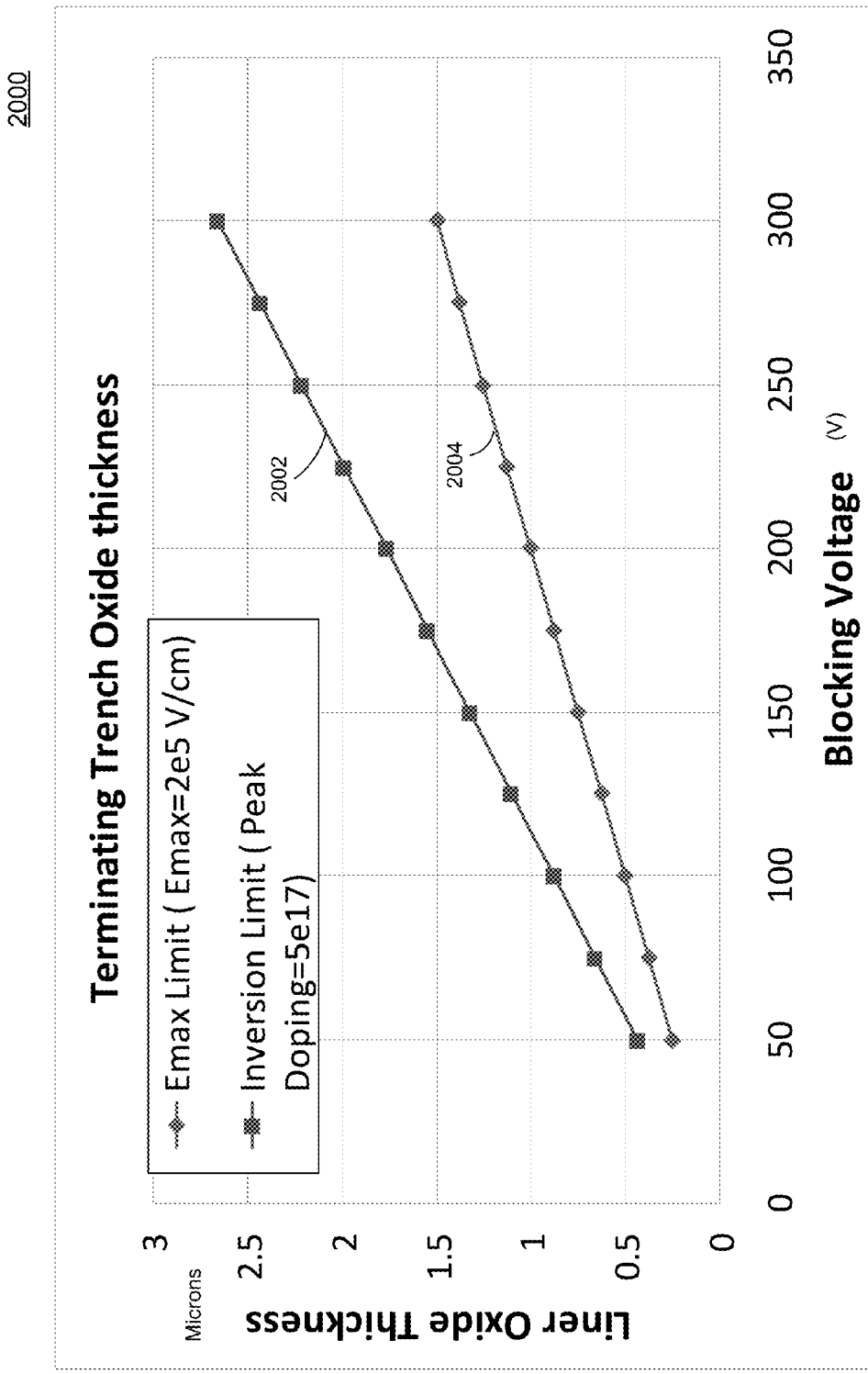
FIG. 20 is a graph of theoretical calculations for termination trench liner oxide versus breakdown voltage in accordance with various embodiments of the invention.

FIG. 20 is a graph 2000 of theoretical calculations for terminating trench liner oxide versus breakdown voltage in accordance with various embodiments of the invention. Within the present embodiment of the graph 2000, the Y-axis represents the termination trench liner oxide thickness in microns (or micrometers) while the X-axis represents the blocking (or breakdown) voltage in volts (V). Specifically, graph 2000 shows the thickness of the terminating trench liner oxide versus the blocking voltage based on two criteria; the maximum oxide electric field of $2\times10^5$ V/cm and the strong inversion limit for the parasitic channel formed along the terminating trench assuming a peak doping concentration of $5\times10^{17}$ cm$^{-3}$. It is noted that within graph 2000, the strong inversion limit is represented by line 2002 while the maximum oxide electric field limit is represented by line 2004.

In an embodiment, the oxide thickness based on the maximum electric field 2004 is given by the following relationship:

$$Tox = BV/Emax$$

where Tox is the terminating trench liner oxide thickness, BV is the MOSFET blocking voltage, and Emax is the maximum oxide electric field. Additionally, in an embodiment, the oxide thickness based on strong inversion limit 2002 is given by the following relationship:

$$Tox = \in_{ox}*(BV-2*\phi f)/(\sqrt{2*\in_s*q*Nd*2*\phi_f})$$

where Tox is the terminating trench liner oxide thickness, BV is the MOSFET blocking voltage, Emax is the maximum oxide electric field, $\in_{ox}$ is the oxide permittivity, $\in_s$ is the silicon permittivity, Nd is the peak epitaxial doping, and $\phi_f$ is the bulk potential. It is pointed out that in an embodiment, the actual criteria used for selecting the terminating trench oxide thickness can depend upon the termination design, and may use one or both of the criteria.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A semiconductor device comprising:
   a termination trench formed in a substrate, said termination trench comprises:
   a first oxide that lines the sidewalls and bottom of said termination trench; and
   a first polysilicon located between said first oxide and extending more than half the depth of said termination trench;
   a core trench formed in said substrate, said core trench comprises:
   a second oxide that lines the sidewalls and bottom of said core trench; and
   a second polysilicon located between said second oxide, said second polysilicon is deeper than said first polysilicon;
   a mesa of said substrate located between said core trench and said termination trench, a surface of said termination trench is a first surface of said mesa and a surface of said core trench is a second surface of said mesa; and
   a third oxide located above said mesa and directly contacts said first oxide, said first polysilicon, and said second oxide;
   said termination trench is wider than said core trench, said termination trench is deeper than said core trench, said first oxide within said termination trench is thicker than said second oxide within said core trench, and said first polysilicon is wider than said second polysilicon.

2. The semiconductor device of claim 1, wherein said termination trench is approximately twice as wide as said core trench.

3. The semiconductor device of claim 1, wherein said third oxide is a layer that directly contacts said second polysilicon, said first oxide, said first polysilicon, and said second oxide.

4. The semiconductor device of claim 1, wherein said mesa comprises a doped region within its upper surface and said doped region is coupled to a voltage ground.

5. The semiconductor device of claim 1, wherein said core trench further comprises:
   a third polysilicon located between said second oxide; and
   dielectric material located between said second polysilicon and said third polysilicon.

6. The semiconductor device of claim 1, further comprising:
   a gate core trench formed in said substrate that is less than half as deep as said core trench.

7. The semiconductor device of claim 1, wherein said semiconductor device is an N-channel device.

8. The semiconductor device of claim 1, wherein said semiconductor device is an P-channel device.

9. The semiconductor device of claim 1, wherein said core trench is a source core trench.

10. A semiconductor device comprising:
    a termination trench formed in a substrate, said termination trench comprises:
    a first oxide that lines the sidewalls and bottom of said termination trench; and
    a first polysilicon located between said first oxide and extending more than half the depth of said termination trench;
    a core trench formed in said substrate, said core trench comprises:
    a second oxide that lines the sidewalls and bottom of said core trench; and a second polysilicon located between said second oxide, said second polysilicon is deeper than said first polysilicon;

a mesa of said substrate located between said core trench and said termination trench, a surface of said termination trench is a first surface of said mesa and a surface of said core trench is a second surface of said mesa; said mesa comprises a doped region; and a third oxide located above said mesa and directly contacts said first oxide, said first polysilicon, and said second oxide;

said termination trench is wider than said core trench, said termination trench is deeper than said core trench, said first oxide within said termination trench is thicker than said second oxide within said core trench, and said first polysilicon is wider than said second polysilicon.

11. The semiconductor device of claim 10, wherein said termination trench is approximately twice as wide as said core trench.

12. The semiconductor device of claim 10, wherein said third oxide is a layer that contacts said second polysilicon, said first oxide, said first polysilicon, and said second oxide.

13. The semiconductor device of claim 10, wherein said core trench further comprises:
a third polysilicon located between said second oxide.

14. The semiconductor device of claim 10, wherein said core trench is a source core trench.

15. A semiconductor device comprising:
a termination trench formed in a substrate, said termination trench comprises:
a first oxide that lines the sidewalls and bottom of said termination trench; said first oxide comprises a silicon dioxide; and
a first polysilicon located between said first oxide and extending more than half the depth of said termination trench;
a core trench formed in said substrate, said core trench comprises:
a second oxide that lines the sidewalls and bottom of said core trench; and
a second polysilicon located between said second oxide, said second polysilicon is deeper than said first polysilicon;
a mesa of said substrate located between said core trench and said termination trench, a surface of said termination trench is a first surface of said mesa and a surface of said core trench is a second surface of said mesa; and
a third oxide located above said mesa and directly contacts said first oxide, said first polysilicon, and said second oxide;
said termination trench is wider than said core trench, said termination trench is deeper than said core trench, said first oxide within said termination trench is thicker than said second oxide within said core trench, and said first polysilicon is wider than said second polysilicon.

16. The semiconductor device of claim 15, wherein said core trench further comprises:
a third polysilicon located between said second oxide.

17. The semiconductor device of claim 15, wherein said semiconductor device an N-channel device.

18. The semiconductor device of claim 15, wherein said semiconductor device an P-channel device.

19. The semiconductor device of claim 15, wherein said core trench is a source core trench.

20. The semiconductor device of claim 15, wherein said mesa comprises a doped region within its upper surface.

* * * * *